US010978474B2

(12) United States Patent
Lindsay et al.

(10) Patent No.: US 10,978,474 B2
(45) Date of Patent: Apr. 13, 2021

(54) DEVICES INCLUDING STACK STRUCTURES, AND RELATED METHODS AND ELECTRONIC SYSTEMS

(71) Applicant: Micron Technology, Inc., Boise, ID (US)

(72) Inventors: Roger W. Lindsay, Boise, ID (US); Michael A. Smith, Boise, ID (US); Brett D. Lowe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/553,587

(22) Filed: Aug. 28, 2019

(65) Prior Publication Data

US 2019/0386021 A1 Dec. 19, 2019

Related U.S. Application Data

(63) Continuation of application No. 16/183,392, filed on Nov. 7, 2018, now Pat. No. 10,446,579, which is a
(Continued)

(51) Int. Cl.
*H01L 27/11582* (2017.01)
*H01L 27/11565* (2017.01)
(Continued)

(52) U.S. Cl.
CPC .... *H01L 27/11582* (2013.01); *H01L 21/0273* (2013.01); *H01L 21/0332* (2013.01);
(Continued)

(58) Field of Classification Search
CPC .................. H01L 27/11524; H01L 27/11575
(Continued)

(56) References Cited

U.S. PATENT DOCUMENTS 8,320,181 B2   11/2012  Violette
8,765,598 B2   7/2014   Smith et al.
(Continued)

FOREIGN PATENT DOCUMENTS

CN    105280615 A    1/2016
CN    105448925 A    3/2016
(Continued)

OTHER PUBLICATIONS

Chinese Office Action and Search Report from Chinese Application No. 201810514781.4, dated Jun. 4, 2019, 20 pages.
(Continued)

*Primary Examiner* — David Vu
*Assistant Examiner* — Brandon C Fox
(74) *Attorney, Agent, or Firm* — TraskBritt

(57) ABSTRACT

A method of forming a semiconductor device structure comprises forming a stack structure comprising stacked tiers. Each of the stacked tiers comprises a first structure comprising a first material and a second structure comprising a second, different material longitudinally adjacent the first structure. A patterned hard mask structure is formed over the stack structure. Dielectric structures are formed within openings in the patterned hard mask structure. A photoresist structure is formed over the dielectric structures and the patterned hard mask structure. The photoresist structure, the dielectric structures, and the stack structure are subjected to a series of material removal processes to form apertures extending to different depths within the stack structure. Dielectric structures are formed over side surfaces of the stack structure within the apertures. Conductive contact structures are formed to longitudinally extend to bottoms of the apertures. Semiconductor device structures, semiconductor devices, and electronic systems are also described.

19 Claims, 24 Drawing Sheets

Related U.S. Application Data continuation of application No. 15/606,415, filed on May 26, 2017, now Pat. No. 10,141,330.

(51) Int. Cl.

| | | |
|---|---|---|
| *H01L 27/11573* | (2017.01) | |
| *H01L 21/768* | (2006.01) | |
| *H01L 21/033* | (2006.01) | |
| *H01L 21/027* | (2006.01) | |
| *H01L 21/311* | (2006.01) | |
| *H01L 23/528* | (2006.01) | |
| *H01L 23/522* | (2006.01) | |
| *H01L 27/11556* | (2017.01) | |
| *H01L 27/11575* | (2017.01) | |
| *H01L 27/11524* | (2017.01) | |
| *H01L 27/1157* | (2017.01) | |

(52) U.S. Cl.
CPC .... *H01L 21/0337* (2013.01); *H01L 21/31116* (2013.01); *H01L 21/31144* (2013.01); *H01L 21/76802* (2013.01); *H01L 21/76805* (2013.01); *H01L 21/76816* (2013.01); *H01L 21/76831* (2013.01); *H01L 21/76877* (2013.01); *H01L 23/528* (2013.01); *H01L 23/5226* (2013.01); *H01L 27/1157* (2013.01); *H01L 27/11524* (2013.01); *H01L 27/11556* (2013.01); *H01L 27/11565* (2013.01); *H01L 27/11573* (2013.01); *H01L 27/11575* (2013.01)

(58) Field of Classification Search
USPC ......................................................... 257/324
See application file for complete search history.

(56) References Cited

U.S. PATENT DOCUMENTS

| | | | |
|---|---|---|---|
| 9,070,447 B2* | 6/2015 | Chen | ............... H01L 27/11582 |
| 9,236,392 B1 | 1/2016 | Izumi et al. | |
| 9,269,660 B2* | 2/2016 | Chen | ............... H01L 23/5226 |
| 9,343,322 B2 | 5/2016 | Chen | |
| 9,679,946 B2 | 6/2017 | Shepard | |
| 9,716,104 B2* | 7/2017 | Kim | ............... H01L 27/11565 |
| 10,141,330 B1* | 11/2018 | Lindsay | ............ H01L 21/76816 |
| 10,446,579 B2* | 10/2019 | Lindsay | .............. H01L 21/0273 |
| 2009/0020744 A1* | 1/2009 | Mizukami | ......... H01L 21/76831 |
| | | | 257/4 |
| 2009/0212350 A1* | 8/2009 | Kidoh | ................. H01L 27/0688 |
| | | | 257/324 |
| 2013/0095654 A1 | 4/2013 | Yong-Hyun et al. | |
| 2014/0264718 A1* | 9/2014 | Wada | ................... H01L 23/481 |
| | | | 257/499 |
| 2015/0206882 A1 | 7/2015 | Chen | |
| 2016/0322374 A1 | 11/2016 | Sano et al. | |

FOREIGN PATENT DOCUMENTS

| | | |
|---|---|---|
| KR | 10-2013-0007200 A | 1/2013 |
| KR | 10-2016-0094827 A | 8/2016 |

OTHER PUBLICATIONS

International Search Report from International Application No. PCT/US2018/031130, dated Sep. 11, 2018, 3 pages.
International Written Opinion from International Application No. PCT/US2018/031130, dated Sep. 11, 2018, 8 pages.
Taiwanese Office Action and Search Report from Taiwanese Application No. 107116910, dated Jul. 23, 2019, 19 pages.

* cited by examiner

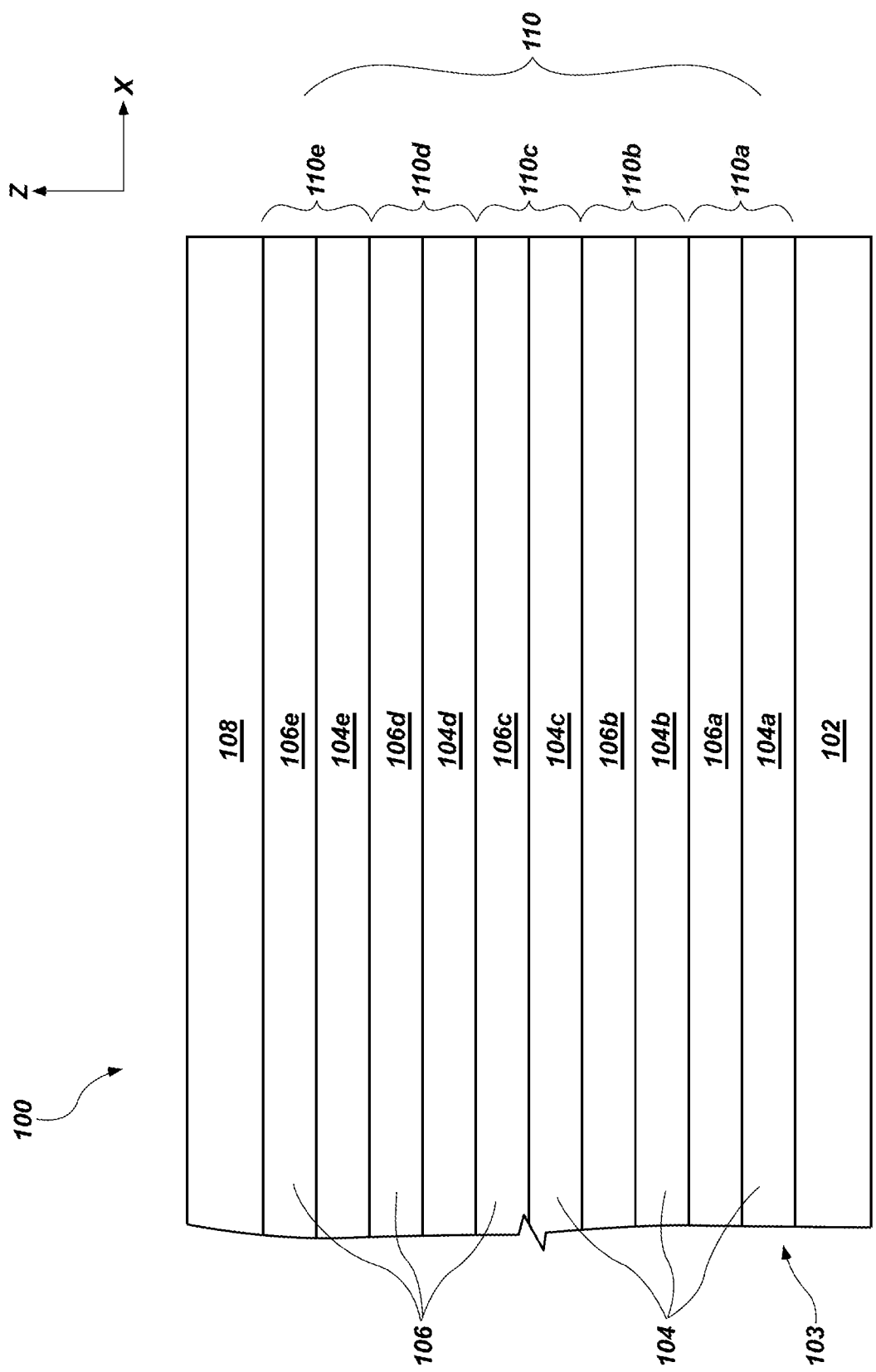

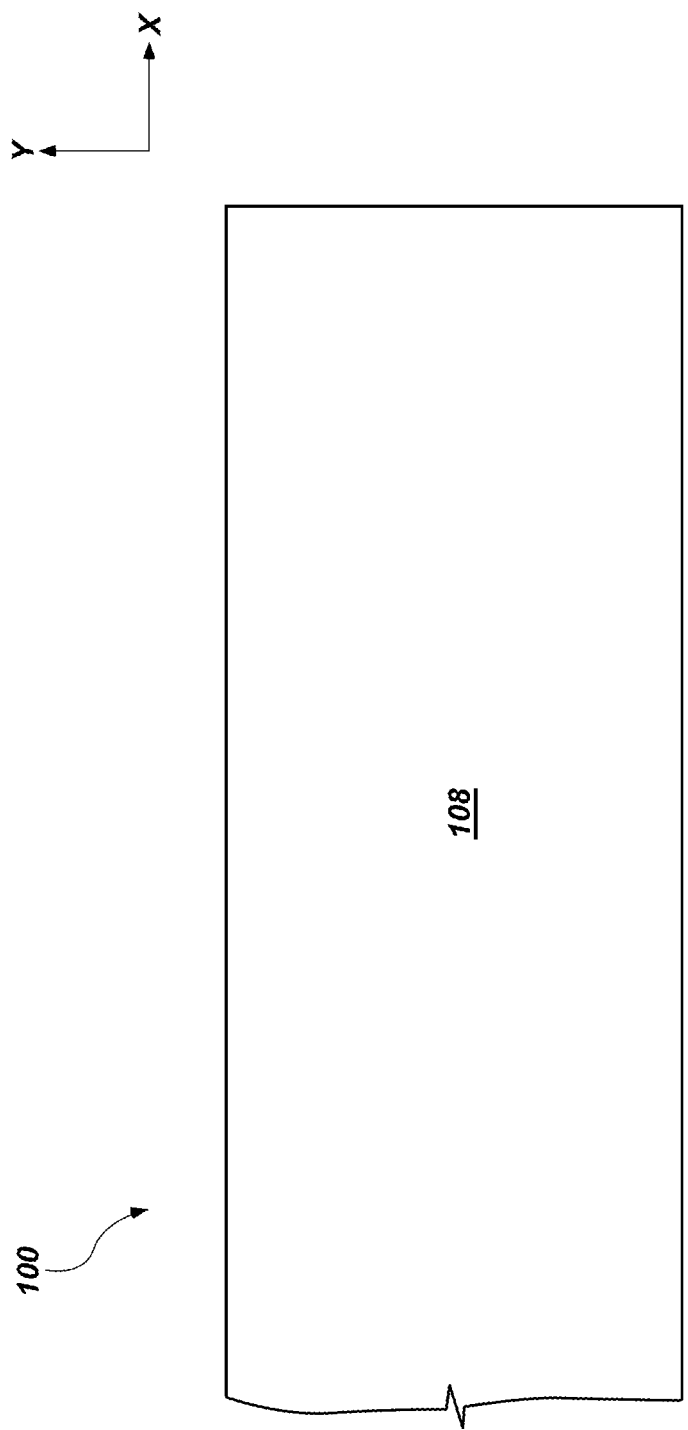

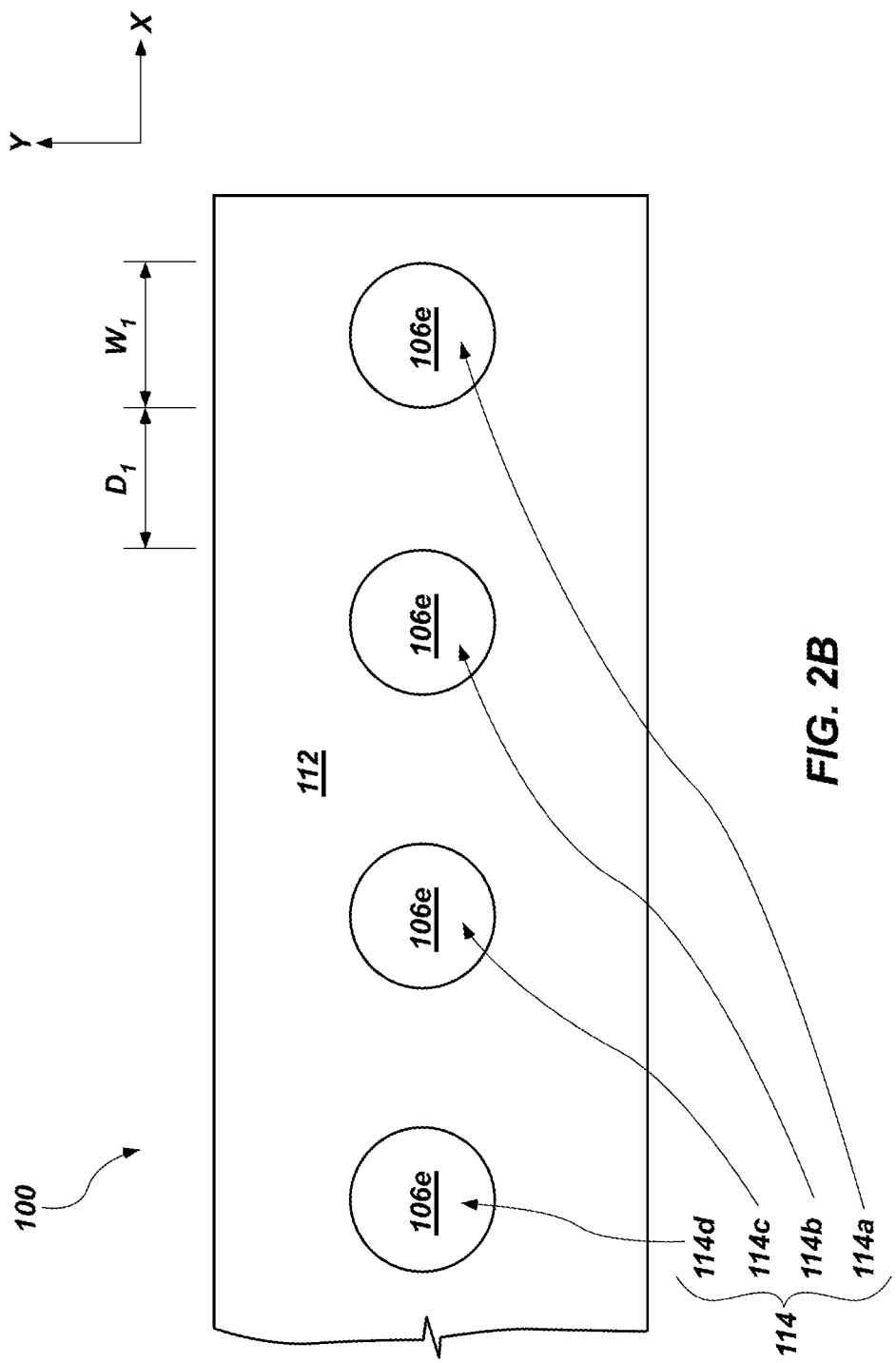

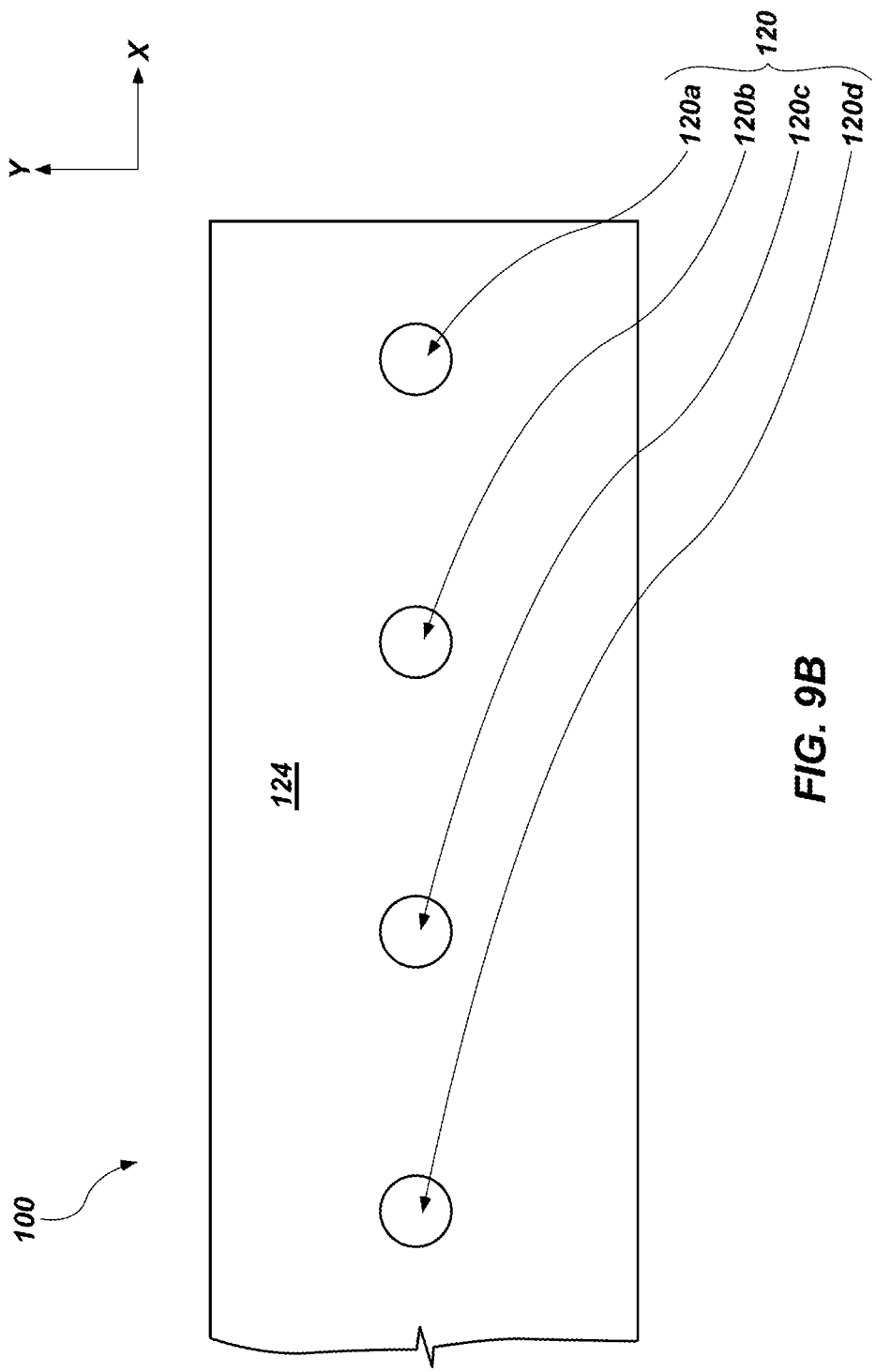

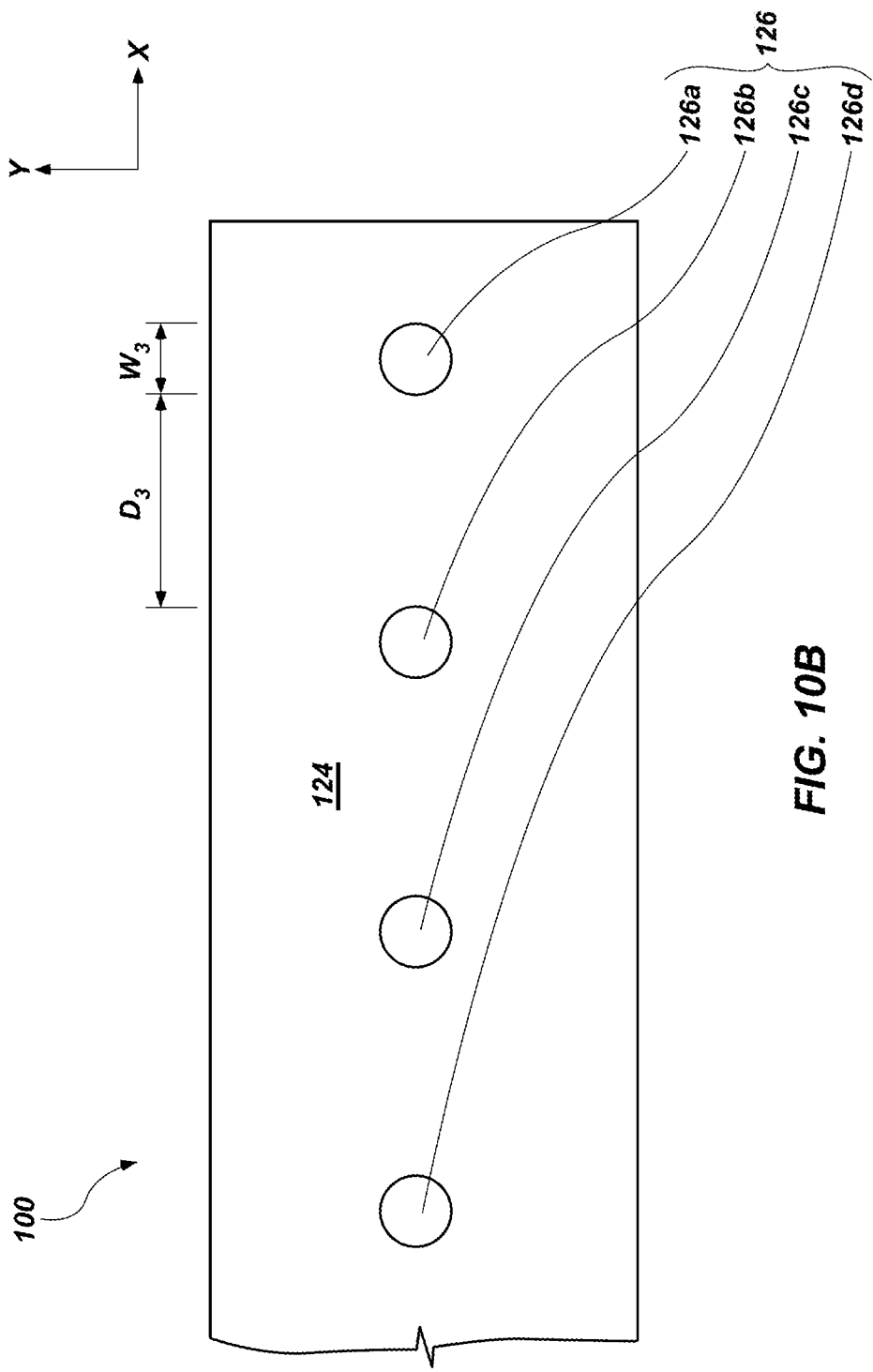

DEVICES INCLUDING STACK STRUCTURES, AND RELATED METHODS AND ELECTRONIC SYSTEMS

CROSS-REFERENCE TO RELATED APPLICATIONS

This application is a continuation of U.S. patent application Ser. No. 16/183,392, filed Nov. 7, 2018, now U.S. Pat. No. 10,446,579 issued Oct. 15, 2019, which is a continuation of U.S. patent application Ser. No. 15/606,415, filed May 26, 2017, now U.S. Pat. No. 10,141,330, issued Nov. 27, 2018, the disclosure each of which is hereby incorporated herein in its entirety by this reference.

TECHNICAL FIELD

The disclosure, in various embodiments, relates generally to the field of semiconductor device design and fabrication. More specifically, the disclosure relates to methods of forming semiconductor device structures, and to related semiconductor device structures, semiconductor devices, and electronic systems.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes semiconductor pillars extending through openings in tiers of conductive structures (e.g., word line plates, control gate plates) and dielectric materials at each junction of the semiconductor pillars and the conductive structures. Such a configuration permits a greater number of transistors to be located in a unit of die area by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming a so-called "stair step" (or "staircase") structure at edges of the tiers of conductive structures. The stair step structure includes individual "steps" defining contact regions of the conductive structures upon which contact structures can be positioned to provide electrical access to the conductive structures.

As vertical memory array technology has advanced, additional memory density has been provided by forming vertical memory arrays to include additional tiers of conductive structures, and, hence, additional steps in the stair step structures associated therewith. However, increasing the number of steps of a stair step structure without undesirably increasing the overall width (e.g., lateral footprint) of the stair step structure can decrease the acceptable margin of error associated with different acts in the process of forming the increased number of steps. A conventional process of forming a stair step structure may include repeated acts of trimming a uniform width of a mask (e.g., photoresist) overlying alternating conductive structures and insulating structures, etching portions of the insulating structures not covered by a remaining portion of the mask, and then etching portions of the conductive structures not covered by remaining portions of the insulating structures. Each of these repeated acts has an associated margin of error permitting the steps of the stair step structure to be suitably sized and positioned to form contact structures thereon. As the number of repeated acts increases, deviation from a desired step width and/or a desired step position may be compounded because errors in the size and/or position of one structure are transferred to subsequently formed structures later in the process. For a large number of steps in the stair step structure, margins of error to achieve suitably sized and positioned steps may be small, such as less than one percent (1%). Achieving such small margins of error can be very difficult using conventional methods, which may result in improperly positioned contact structures and may undesirably decrease yield (e.g., the number of memory cells that are validly programmable and erasable as a percentage of the total number of memory cells in a given batch).

In view of the foregoing, there remains a need for new semiconductor device structures, such as memory array blocks for 3D non-volatile memory devices (e.g., 3D NAND Flash memory devices), as well as for associated semiconductor devices and electronic systems including the new semiconductor device structures, and simple, cost-efficient methods of forming the new semiconductor device structures.

BRIEF DESCRIPTION OF THE DRAWINGS

FIGS. 1A through 10C are partial cross-sectional (FIGS. 1A, 2A, 3A, 4A, 5A, 6A, 7A, 8A, 9A, and 10A) and partial top-down (FIGS. 1B, 2B, 2C, 3B, 4B, 5B, 6B, 7B, 8B, 9B, 10B, and 10C) views illustrating a method of forming a semiconductor device structure, in accordance with embodiments of the disclosure.

DETAILED DESCRIPTION

Figure 2A:
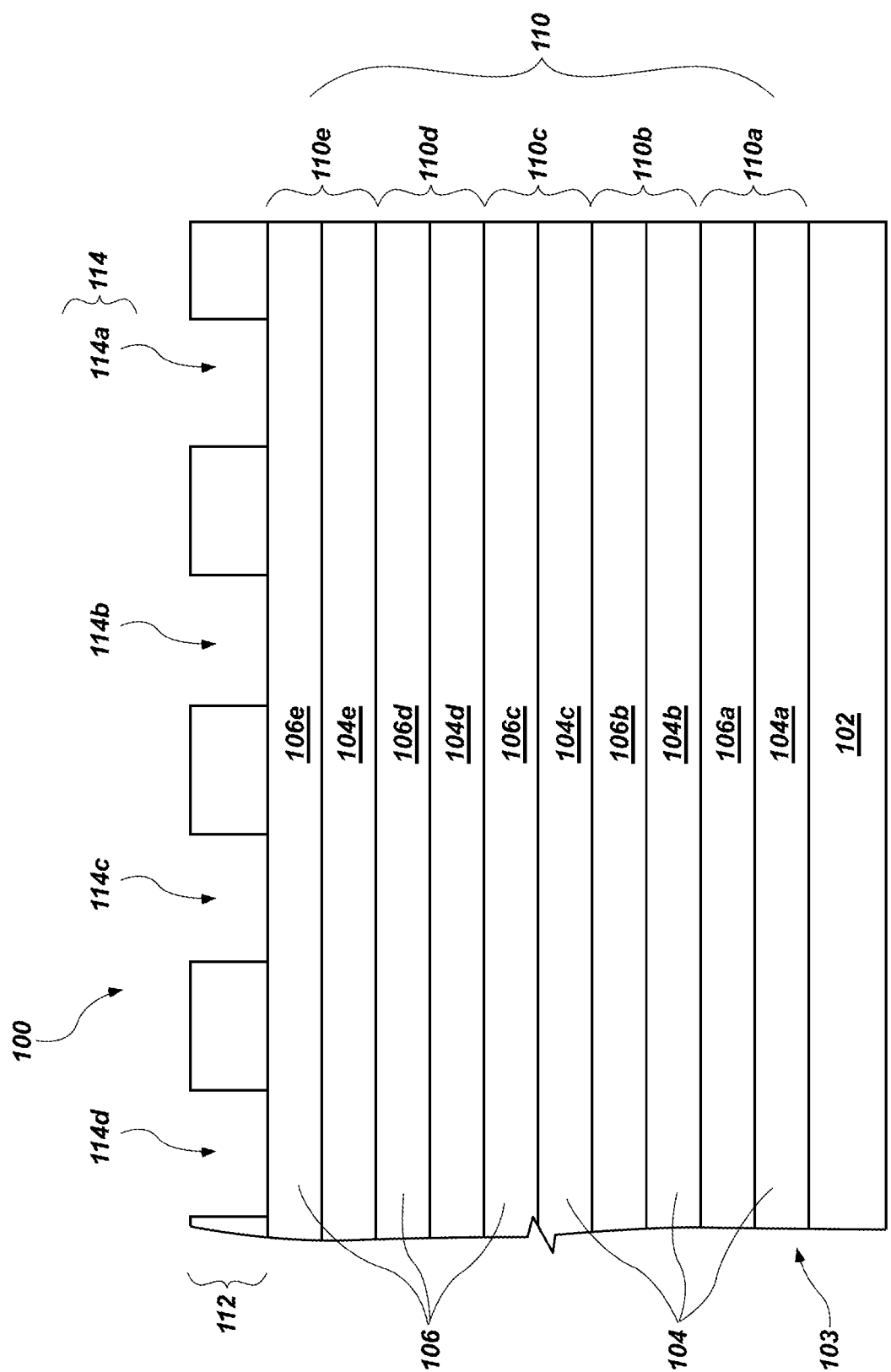

Methods of forming semiconductor device structures are described, as are related semiconductor device structures, semiconductor devices (e.g., vertical memory devices, such as 3D NAND Flash memory devices), and electronic systems. In some embodiments, a method of forming a semiconductor device structure includes forming a stack structure comprising longitudinally stacked tiers each individually including a conductive structure and an insulating structure longitudinally adjacent the conductive structure. A hard mask structure is formed over the stack structure, and portions of the hard mask structure are then selectively removed (e.g., selectively etched) to form a patterned hard mask structure having openings extending therethrough. Dielectric structures are formed within the openings in the patterned hard mask structure. A series of material removal processes are performed after the formation of the dielectric structures to form apertures (e.g., openings, vias, trenches) extending to different depths within the stack structure. The material removal processes each individually remove a portion of the photoresist structure, one or more of the dielectric structures not covered by a remaining portion of the photoresist structure, and one or more portions of the stack structure not covered by one or more of the patterned hard mask structure and the remaining portion of the photoresist structure. Dielectric structures are formed over side surfaces of the stack structure within the apertures, and conductive contact structures are then formed within remaining open spaces (e.g., spaces unoccupied by the dielectric structures) of the apertures and longitudinally extend to bottoms of the apertures. Optionally, prior to forming the dielectric structures within the apertures, a masking material may be formed within one or more of the apertures, and depths of one or more other of the apertures may be increased. The masking material may then be removed, so that the dielectric structures may be formed within the apertures. The methods of the disclosure may decrease error propagation as compared to conventional methods of forming of semiconductor device structures that rely on the formation of stair step (e.g., staircase) structures, and may be effectuated without increasing the number of processing materials and/or the number of processing acts utilized by such conventional methods of forming of semiconductor device structures. The methods and structures of the disclosure may enhance the manufacturability of semiconductor device structures and electronic systems, facilitating the efficient formation of semiconductive devices and electronic systems exhibiting improved performance as compared to conventional semiconductive devices and conventional electronic systems.

The following description provides specific details, such as material compositions and processing conditions, in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

As used herein, the terms "vertical," "longitudinal," "horizontal," and "lateral" are in reference to a major plane of a substrate in or on which the structures described are formed and are not necessarily defined by earth's gravitational field. A "horizontal" or "lateral" direction is a direction that is substantially parallel to the major plane of the substrate, while a "vertical" or "longitudinal" direction is a direction that is substantially perpendicular to the major plane of the substrate. The major plane of the substrate is defined by a surface of the substrate having a relatively large area compared to other surfaces of the substrate, such as by a substantially planar circular surface of a conventional semiconductor wafer substrate.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, material distribution, and arrangement of one or more of at least one structure and at least one apparatus facilitating operation of one or more of the structure and the apparatus in a pre-determined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

FIGS. 1A through 10C are simplified partial cross-sectional (FIGS. 1A, 2A, 3A, 4A, 5A, 6A, 7A, 8A, 9A, and 10A) and partial top-down (FIGS. 1B, 2B, 2C, 3B, 4B, 5B, 6B, 7B, 8B, 9B, 10B, and 10C) views illustrating embodiments of a method of forming a semiconductor device structure, such as a semiconductor device structure for a vertical memory device (e.g., a 3D NAND Flash memory device). The semiconductor device structures formed through the methods of the disclosure may be free of stair step (e.g., staircase) structures, such as the stair step structures employed by many conventional semiconductor device structures (e.g., vertical memory device structures) to facilitate electrical connections between access lines (e.g., wordlines) and conductive structures (e.g., control gate plates) of different tiers of a stack structure. With the description provided below, it will be readily apparent to one of ordinary skill in the art that the methods and structures described herein may be used in various devices.

Referring to FIG. 1A, a semiconductor device structure 100 may include a substrate 102, a stack structure 103 over the substrate 102, and a hard mask structure 108 over the stack structure 103. As shown in FIG. 1A, the stack structure 103 includes alternating conductive structures 104 and insulating structures 106 arranged in tiers 110. For clarity and ease of understanding of the drawings and related description, FIG. 1A shows the stack structure 103 including five (5) tiers 110 of the conductive structures 104 and the insulating structures 106. A first tier 110a includes a first conductive structure 104a and a first insulating structure 106a over the first conductive structure 104a; a second tier 110b overlies the first tier 110a, and includes a second conductive structure 104b and a second insulating structure 106b over the second conductive structure 104b; a third tier 110c overlies the second tier 110b, and includes a third conductive structure 104c and a third insulating structure 106c over the third conductive structure 104c; a fourth tier 110d overlies the third tier 110c, and includes a fourth conductive structure 104d and a fourth insulating structure 106d over the fourth conductive structure 104d; and a fifth tier 110e overlies the fourth tier 110d, and includes a fifth conductive structure 104e and a fifth insulating structure 106e over the fifth conductive structure 104e. However, the stack structure 103 may include a different number of tiers 110. For example, in additional embodiments, the stack structure 103 may include greater than five (5) tiers 110 (e.g., greater than or equal to ten (10) tiers 110, greater than or equal to twenty-five (25) tiers 110, greater than or equal to fifty (50) tiers 110, greater than or equal to one hundred (100) tiers 110) of the conductive structures 104 and the insulating structures 106, or may include less than five (5) tiers 110 (e.g., less than or equal to three (3) tiers 110) of the conductive structures 104 and the insulating structures 106. FIG. 1B is a top-down view of the semiconductor device structure 100 at the processing stage depicted in FIG. 1A.

The conductive structures 104 may be formed of and include at least one conductive material, such as a conductively-doped semiconductor material (e.g., conductively-doped polysilicon, conductively-doped germanium, conductively-doped silicon germanium), a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), or combinations thereof. In some embodiments, the conductive structures 104 are formed of and include conductively-doped polysilicon. Each of the conductive structures 104 may individually include a substantially homogeneous distribution or a substantially heterogeneous distribution of the at least one conductive material. As used herein, the term "homogeneous distribution" means amounts of a material do not vary throughout different portions (e.g., different lateral and longitudinal portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the conductive structures 104 exhibits a substantially homogeneous distribution of conductive material. In additional embodiments, at least one of the conductive structures 104 exhibits a substantially heterogeneous distribution of at least one conductive material. The conductive structure 104 may, for example, be formed of and include a stack of at least two different conductive materials. The conductive structures 104 may each be substantially planar, and may each individually exhibit any desired thickness.

Each of the conductive structures 104 may be substantially the same (e.g., exhibit substantially the same material composition, average grain size, material distribution, size, and shape) as one another, or at least one of the conductive structures 104 may be different (e.g., exhibit one or more of a different material composition, a different average grain size, a different material distribution, a different size, and a different shape) than at least one other of the conductive structures 104. As a non-limiting example, each of the first conductive structure 104a, the second conductive structure 104b, the third conductive structure 104c, the fourth conductive structure 104d, and the fifth conductive structure 104e may exhibit substantially the same material composition, material distribution, and thickness. As another non-limiting example, at least one of the first conductive structure 104a, the second conductive structure 104b, the third conductive structure 104c, the fourth conductive structure 104d, and the fifth conductive structure 104e may exhibit one or more of a different material composition, a different material distribution, and a different thickness than at least one other of the first conductive structure 104a, the second conductive structure 104b, the third conductive structure 104c, the fourth conductive structure 104d, and the fifth conductive structure 104e. In some embodiments, each of the conductive structures 104 is substantially the same as each other of the conductive structures 104.

The insulating structures 106 may be formed of and include at least one insulating material, such as an oxide material (e.g., silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof), a nitride material (e.g., silicon nitride), an oxynitride material (e.g., silicon oxynitride), amphorous carbon, or a combination thereof. In some embodiments, the insulating structures 106 are formed of and include silicon dioxide. Each of the insulating structures 106 may individually include a substantially homogeneous distribution or a substantially heterogeneous distribution of the at least one insulating material. In some embodiments, each of the insulating structures 106 exhibits a substantially homogeneous distribution of insulating material. In additional embodiments, at least one of the insulating structures 106 exhibits a substantially heterogeneous distribution of at least one conductive material. The conductive structure 104 may, for example, be formed of and include a stack (e.g., laminate) of at least two different insulating materials. The insulating structures 106 may each be substantially planar, and may each individually exhibit any desired thickness.

Each of the insulating structures 106 may be substantially the same (e.g., exhibit substantially the same material composition, material distribution, size, and shape) as one another, or at least one of the insulating structures 106 may be different (e.g., exhibit one or more of a different material composition, a different material distribution, a different size, and a different shape) than at least one other of the insulating structures 106. As a non-limiting example, each of the first insulating structure 106a, the second insulating structure 106b, the third insulating structure 106c, the fourth insulating structure 106d, and the fifth insulating structure 106e may exhibit substantially the same material composition, material distribution, and thickness. As another non-limiting example, at least one of the first insulating structure 106a, the second insulating structure 106b, the third insulating structure 106c, the fourth insulating structure 106d, and the fifth insulating structure 106e may exhibit one or more of a different material composition, a different material distribution, and a different thickness than at least one other of the first insulating structure 106a, the second insulating structure 106b, the third insulating structure 106c, the fourth insulating structure 106d, and the fifth insulating structure 106e. In some embodiments, each of the insulating structures 106 is substantially the same as each other of the insulating structures 106.

As shown in FIG. 1A, in some embodiments, the conductive structures 104 and the insulating structures 106 are arranged in an alternating sequence, beginning with one of the conductive structures 104. In additional embodiments, the conductive structures 104 and the insulating structures 106 exhibit a different arrangement relative to one another. By way of non-limiting example, the conductive structures 104 and the insulating structures 106 may be arranged in an alternating sequence beginning with one of the insulating structures 106. Accordingly, each of the tiers 110 may include one of the conductive structures 104 on or over one of the insulating structures 106. A semiconductor device (e.g., a vertical memory device, such as a 3D NAND Flash memory device) employing a semiconductor device structure having such a configuration may have little or no difference in terms of functionality or operability as compared to a semiconductor device employing the arrangement of the conductive structures 104 and the insulating structures 106 shown in FIG. 1A.

The hard mask structure 108 may be formed of and include at least one material (e.g., at least one hard mask material) suitable for use as an etch mask to pattern portions of the stack structure 103 (e.g., portions of the tiers 110, including portions of the conductive structures 104 and portions of the insulating structures 106) to form apertures (e.g., openings, vias, trenches) longitudinally extending (e.g., in the Z-direction) to the conductive structures 104 (e.g., the conductive structures 104a through 104e) of different tiers 110 (e.g., different tiers 110a through 110e) of the stack structure 103, as described in further detail below. By way of non-limiting example, the hard mask structure 108 may be formed of and include at least one metal material (e.g., at least one substantially pure metal, at least one alloy, at least one metal oxide). In some embodiments, the hard mask structure 108 is formed of and includes tungsten (W). In additional embodiments, the hard mask structure 108 is formed of and includes aluminum oxide ($Al_2O_3$). The hard mask structure 108 may be homogeneous (e.g., may include only one material layer), or may be heterogeneous (e.g., may include a stack exhibiting at least two different material layers). In addition, the hard mask structure 108 may exhibit any thickness permitting desired patterning of the stack structure 103 using hard mask structure 108, such as a thickness within a range of from about 1 nanometer (nm) to about 1000 nm.

The substrate 102, the stack structure 103 (including the conductive structures 104 and the insulating structures 106 thereof), and the hard mask structure 108 may each individually be formed using conventional processes including, but not limited to, physical vapor deposition ("PVD"), chemical vapor deposition ("CVD"), atomic layer deposition ("ALD"), and/or spin-coating. PVD includes, but is not limited to, one or more of sputtering, evaporation, and ionized PVD. Such processes are known in the art and, therefore, are not described in detail herein.

Referring next to FIG. 2A, portions of the hard mask structure 108 (FIG. 1A) are removed (e.g., etched) to form a patterned hard mask structure 112 including openings 114 (e.g., apertures, vias) longitudinally extending therethrough. As shown in FIG. 2A, the openings 114 may longitudinally extend (e.g., in the Z-direction) completely through the patterned hard mask structure 112, from an upper surface of the patterned hard mask structure 112 to an upper surface of the stack structure 103 (e.g., an upper surface of the fifth insulating structure 106e of the fifth tier 110e of the stack structure 103). FIG. 2B is a top-down view of the semiconductor device structure 100 at the processing stage depicted in FIG. 2A.

The patterned hard mask structure 112 may be formed to exhibit any desired number of the openings 114. The number of openings 114 included in the patterned hard mask structure 112 may be substantially the same as (e.g., equal to) or may be different than (e.g., less than, or greater than) the number of tiers 110 in the stack structure 103. In some embodiments, the number of openings 114 included in the patterned hard mask structure 112 is less than the number of tiers 110 in the stack structure 103. As a non-limiting example, as shown in FIG. 2A, if the stack structure 103 includes five (5) tiers 110 (e.g., the first tier 110a, the second tier 110b, the third tier 110c, the fourth tier 110d, and the fifth tier 110e), the patterned hard mask structure 112 may be formed to include less than or equal to four (4) openings 114 (e.g., a first opening 114a, a second opening 114b, a third opening 114c, a fourth opening 114d) therein. In additional embodiments, patterned hard mask structure 112 may include a different number of openings 114 (e.g., greater than four (4) openings 114, less than four (4) openings 114). As a non-limiting example, if the stack structure 103 includes five (5) tiers 110, the patterned hard mask structure 112 may be formed to include greater than or equal to five (5) openings 114 therein.

The geometric configuration (e.g., shape, dimensions), lateral position (e.g., in the X-direction and the Y-direction shown in FIG. 2B), and lateral spacing of each of the openings 114 in the patterned hard mask structure 112 at least partially depend on the geometric configuration, lateral position, and lateral spacing of apertures to be formed in the stack structure 103 using the patterned hard mask structure 112, as described in further detail below. In turn, the geometric configuration, lateral position, and lateral spacing of each of the apertures to be formed in in the stack structure 103 may at least partially depend on geometric configurations, lateral positions, and lateral spacing of structures (e.g., dielectric structures, conductive contact structures) to be formed within each of the apertures in the stack structure 103, as also described in further detail below.

In some embodiments, the openings 114 exhibit substantially the same geometric configurations (e.g., substantially the same shapes and substantially the same dimensions) as one another, are regularly (e.g., uniformly, non-variably) laterally spaced apart (e.g., laterally separated, laterally distanced) from one another, and are substantially laterally aligned with one another. For example, as shown in FIG. 2B, each of the openings 114 may exhibit a substantially circular lateral cross-sectional shape, may have substantially the same width $W_1$ (e.g., diameter), may be laterally spaced apart in the X-direction from each other of the openings 114 laterally adjacent thereto by substantially the same distance $D_1$, and may be substantially laterally aligned in the Y-direction with each other of the openings 114. The width $W_1$ of each of the openings 114 may, for example, be less than or equal to about 500 nm (e.g., less than or equal to about 400 nm, less than or equal to about 300 nm). In some embodiments, the width $W_1$ of each of the openings 114 is about 300 nm. In addition, the distance $D_1$ between laterally adjacent openings 114 may, for example, be less than or equal to about 1000 nm (e.g., less than or equal to about 800 nm, less than or equal to about 600 nm, less than or equal to about 500 nm, less than or equal to about 400 nm, less than or equal to about 300 nm). In some embodiments, the distance $D_1$ between laterally adjacent openings 114 is about 300 nm.

Figure 2C:
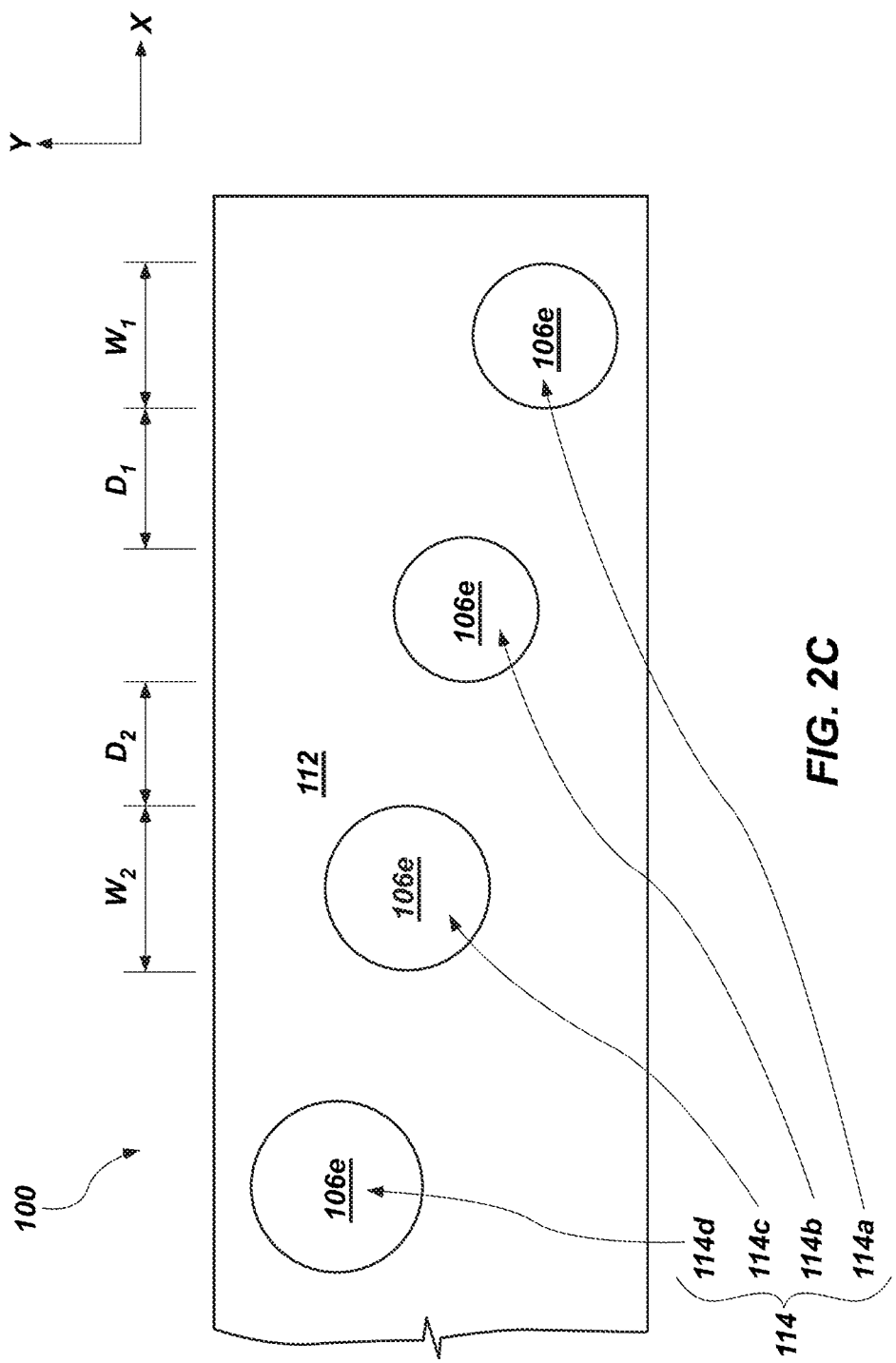

In additional embodiments, the patterned hard mask structure 112 is formed to exhibit a different configuration of the openings 114 than that depicted in FIG. 2B. By way of non-limiting example, one or more of the openings 114 in the patterned hard mask structure 112 may exhibit a different geometric configuration (e.g., a different shape, such as a non-circular lateral cross-sectional shape; and/or different dimensions, such as a smaller width or a larger width) than one or more other of the openings 114, the openings 114 may be non-regularly (e.g., non-uniformly, variably) laterally spaced apart from one another, and/or one or more of the openings 114 may be substantially laterally unaligned with (e.g., laterally offset from) other of the openings 114. For example, as shown in the FIG. 2C, which shows a top down view of the semiconductor device structure 100 at the processing stage depicted in FIG. 2A in accordance with additional embodiments of the disclosure, one or more of the openings 114 may exhibit a first width $W_1$, and one or more other of the openings 114 may exhibit a second width $W_2$ different than (e.g., larger than, smaller than) the first width $W_1$. As another example, as also shown in FIG. 2C, one or more other of the openings 114 may be laterally separated in the X-direction from one or more adjacent openings 114 by a first distance $D_1$, and one or more of other of the openings 114 may be laterally separated in the X-direction from one or more other adjacent openings 114 by a second distance $D_2$ different than (e.g., less than, greater than) the first distance $D_1$. As a further example, as also shown in FIG. 2C, one or more (e.g., each) of the openings 114 may be laterally offset in the Y-direction from one or more other of the openings 114.

With returned reference to FIG. 2A, the patterned hard mask structure 112, including the openings 114 therein, may be formed using conventional processes, such as conventional material removal processes (e.g., conventional etching processes, such as conventional dry etching processes) and conventional processing equipment, which are not described in detail herein.

Figure 3A:
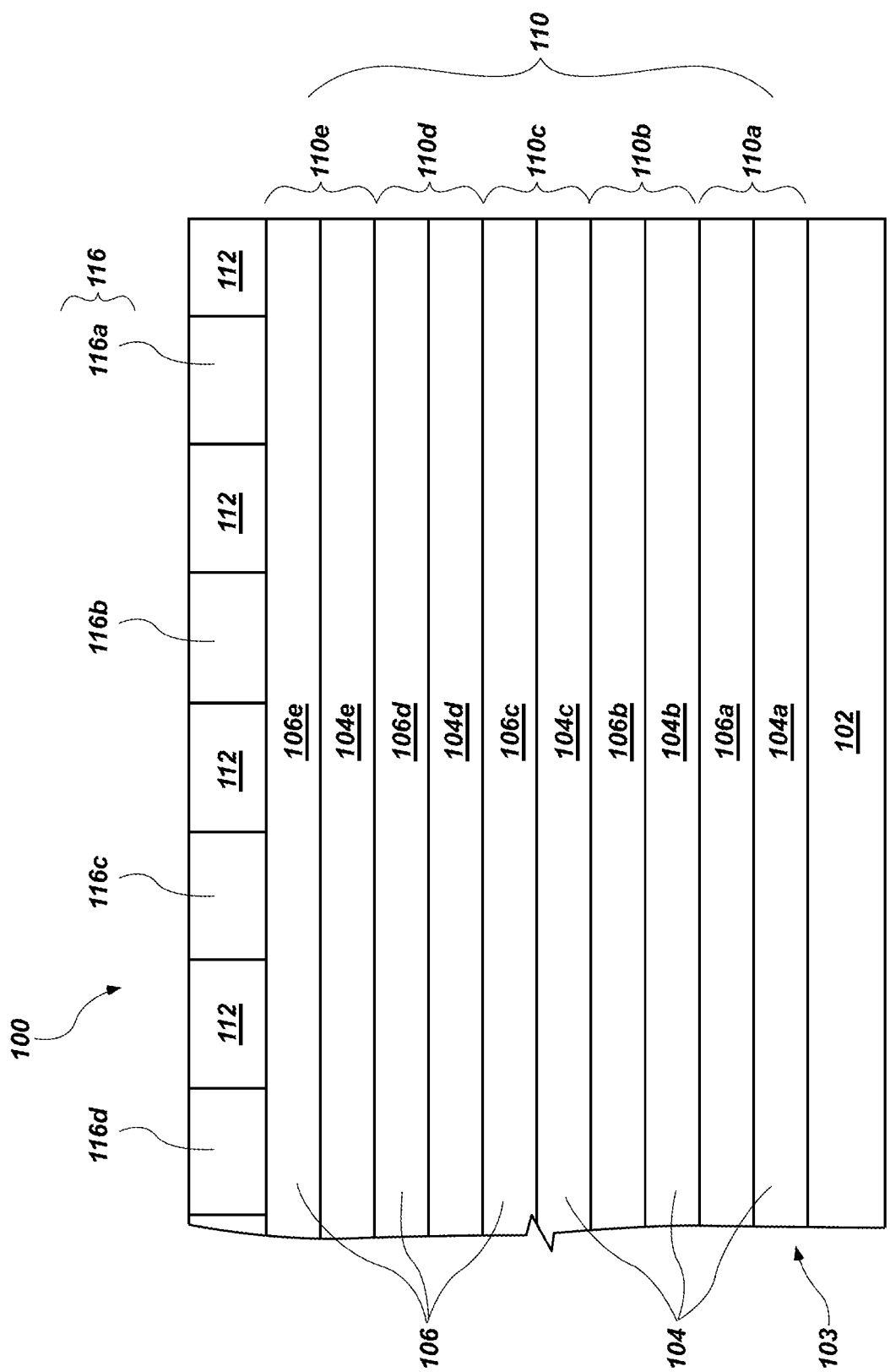
Figure 3B:
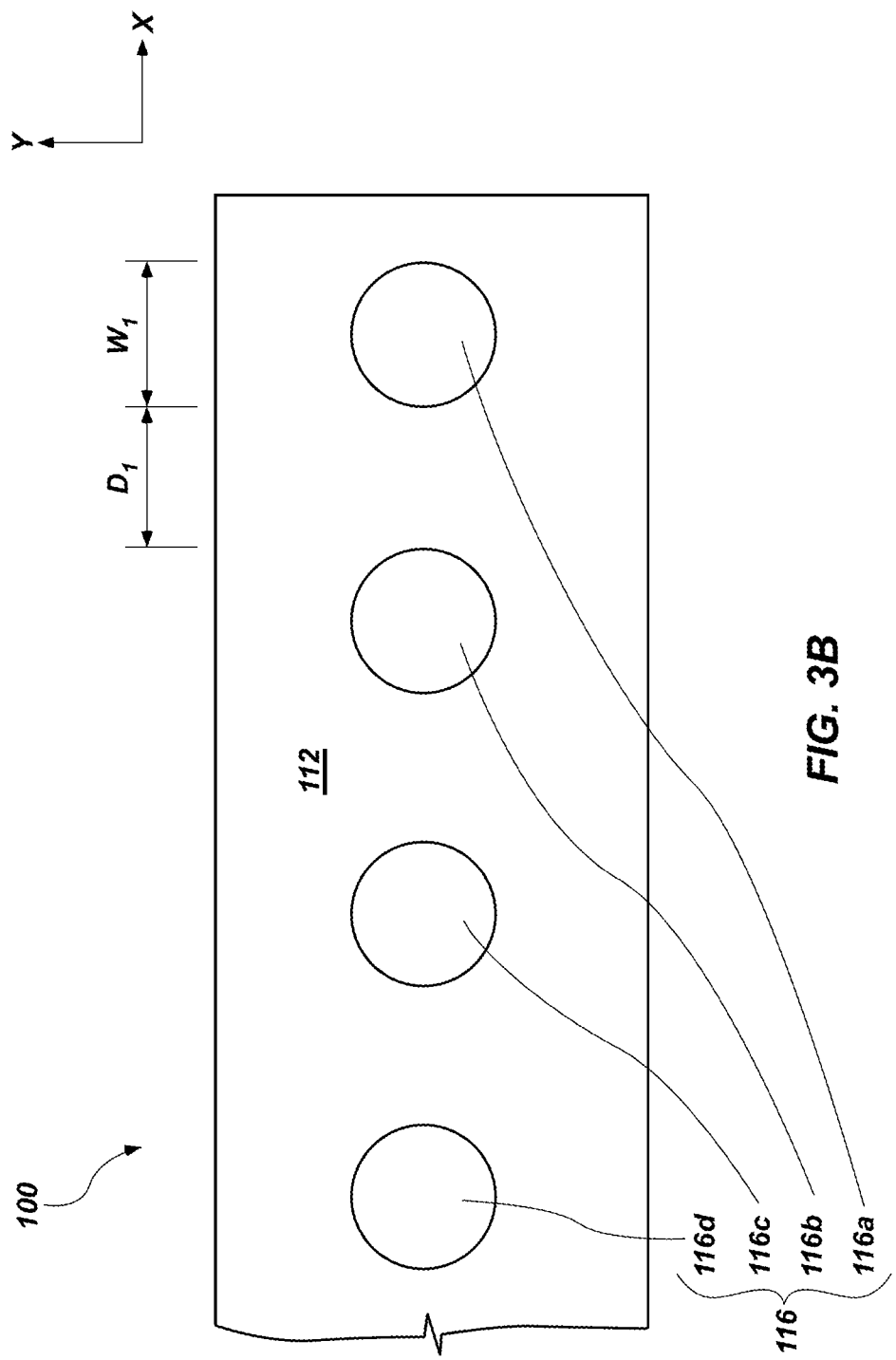

Referring next to FIG. 3A, dielectric structures 116 are formed in the openings 114 (FIGS. 2A and 2B) in the patterned hard mask structure 112. The dielectric structures 116 may substantially fill each of the openings 114. For example, a first dielectric structure 116a may be formed in and may substantially fill the first opening 114a, a second dielectric structure 116b may be formed in and may substantially fill the second opening 114b, a third dielectric structure 116c may be formed in and may substantially fill the third opening 114c, and a fourth dielectric structure 116d may be formed in and may substantially fill the fourth opening 114d. As shown in FIG. 3A, the dielectric structures 116 may be substantially confined (e.g., substantially laterally confined, substantially longitudinally confined) within boundaries (e.g., lateral boundaries, longitudinal boundaries) of the openings 114 (FIGS. 2A and 2B) associated therewith. Accordingly, an upper surface of each of the dielectric structures 116 may be substantially coplanar with an upper surface of the patterned hard mask structure 112. In additional embodiments, the dielectric structures 116 may extend (e.g., laterally extend, longitudinally extend) beyond the boundaries of the openings 114. For example, the dielectric structures 116 may comprise portions of the relatively larger, substantially continuous structure that covers the upper surface of the patterned hard mask structure 112 and extends into and substantially fills each of the openings 114. In such embodiments, an upper surface of the relatively larger, substantially continuous structure may be substantially planar. FIG. 3B is a top-down view of the semiconductor device structure 100 at the processing stage depicted in FIG. 3A.

The dielectric structures 116 may be formed of and include at least one dielectric material. The dielectric material may be selectively etchable relative to at least the materials of the patterned hard mask structure 112 and the conductive structures 104 of the stack structure 103. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. The dielectric structures 116 may, for example, be formed of and include one or more of an oxide material (e.g., silicon dioxide, phosphosilicate glass, borosilicate glass, borophosphosilicate glass, fluorosilicate glass, aluminum oxide, a combination thereof), a nitride material (e.g., silicon nitride), an oxynitride material (e.g., silicon oxynitride), and amphorous carbon. In some embodiments, the etch selectivity of the dielectric material of the dielectric structures 116 is substantially similar to the etch selectivity of the insulating material of the insulating structures 106 of the stack structure 103, such that the dielectric structures 116 and the insulating structures 106 are removed at substantially the same rate by a given etchant. In additional embodiments, the dielectric material of the dielectric structures 116 is selectively etchable relative to the insulating material of the insulating structures 106 of the stack structure 103. The dielectric material of the dielectric structures 116 may be the same as or may be different than the insulating material of the insulating structures 106 of the stack structure 103. In some embodiments, each of the dielectric structures 116 is formed of and includes a silicon oxide (e.g., silicon dioxide).

The dielectric structures 116 may be formed using conventional processes (e.g., conventional deposition processes, such as one or more of a spin-on deposition process, a blanket deposition process, a PVD process, a CVD process, and an ALD process; conventional material removal processes, such as conventional chemical-mechanical planarization (CMP) processes) and conventional processing equipment, which are not described in detail herein. By way of non-limiting example, the patterned hard mask structure 112 may be subjected to a conventional spin-coating process to deposit a dielectric material thereover and within the openings 114 (FIGS. 2A and 2B), and then at least the deposited dielectric material may be subjected to a conventional CMP process to form the dielectric structures 116.

Figure 4A:
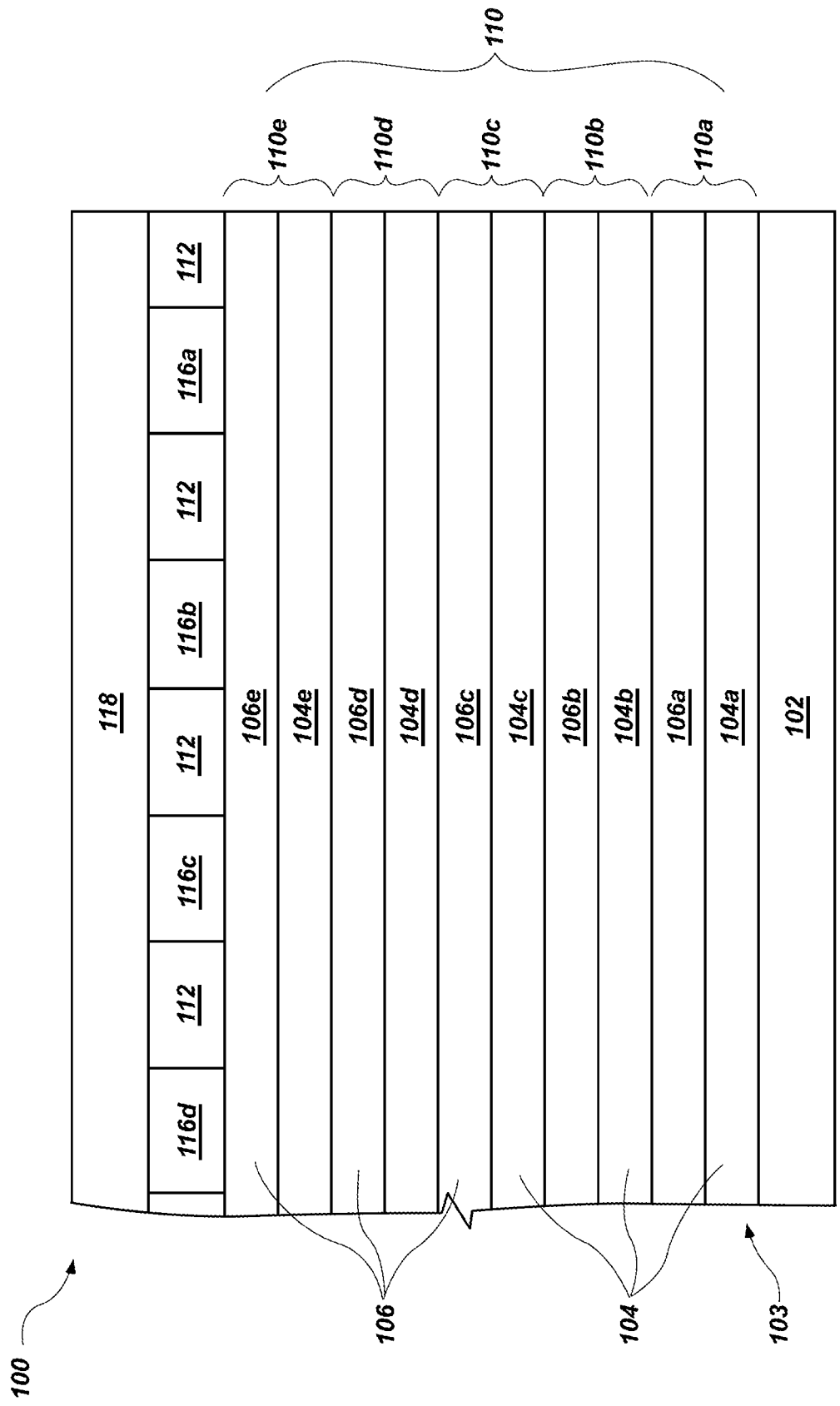
Figure 4B:
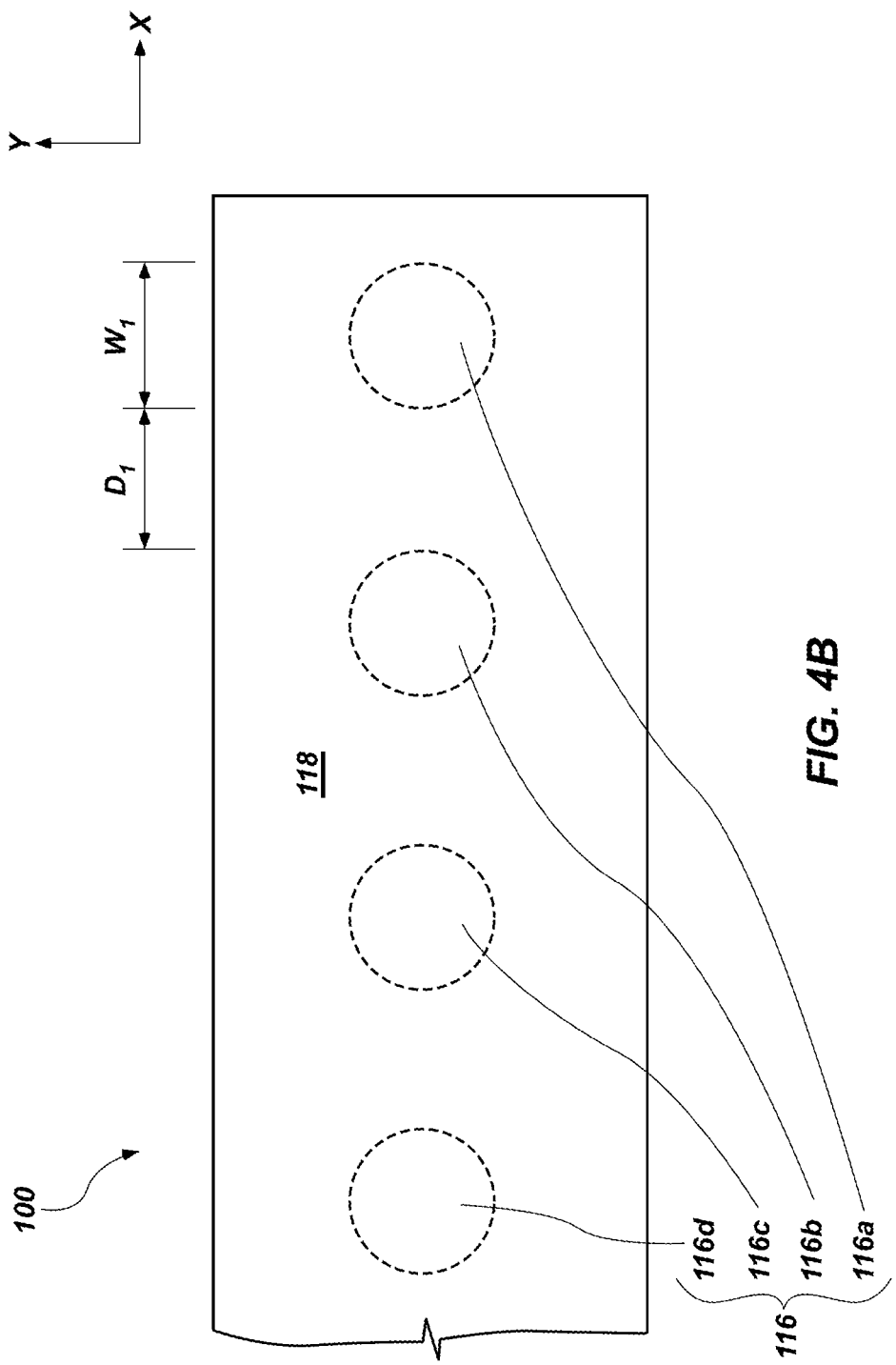

Referring next to FIG. 4A, a photoresist structure 118 is formed on or over the patterned hard mask structure 112 and the dielectric structures 116. The photoresist structure 118 may serve as a mask to facilitate selective removal of one or more of the dielectric structures 116 and portions of the tiers 110 of the conductive structures 104 and the insulating structures 106, as described in further detail below. The photoresist structure 118 may be formed of and include a conventional photoresist material, such as a conventional positive tone photoresist material, or a conventional negative tone photoresist material. If the photoresist structure 118 comprises a positive tone photoresist material, the photoresist structure 118 may be formulated such that regions thereof exposed to at least a minimum threshold dosage of electromagnetic radiation and, optionally, a post-exposure bake become at least partially soluble in a suitable developer (e.g., a positive tone developer). Photoexposed regions (e.g., regions exposed to the minimum threshold dosage of electromagnetic radiation) of the photoresist structure 118 may be at least partially (e.g., substantially) removed by the developer while non-photoexposed regions (e.g., regions not exposed to the minimum threshold dosage of electromagnetic radiation) may remain substantially intact (e.g., not substantially removed), as described in further detail below. Alternatively, if the photoresist structure 118 comprises a negative tone photoresist material, the photoresist structure 118 may be formulated such that regions thereof not exposed to at least a minimum threshold dosage of electromagnetic radiation are at least partially soluble in a suitable developer (e.g., a negative tone developer). Non-photoexposed regions of the photoresist structure 118 may be at least partially (e.g., substantially) removed by the developer while photoexposed regions may remain substantially intact (e.g., not substantially removed), as also described in further detail below. The properties (e.g., tone) of the photoresist structure 118 may be selected relative to material composition of the material(s) (e.g., the dielectric structures 116, the insulating structures 106, the conductive structures 104) underlying the photoresist structure 118 to facilitate desired patterning of the material(s), as described in further detail below. Suitable photoresist materials (e.g., positive tone photoresist materials, negative tone photoresist materials) are known in the art, and are, therefore, not described in detail herein. The photoresist structure 118 may, for example, be compatible with 13.7 nm, 157 nm, 193 nm, 248 nm, or 365 nm wavelength systems; with 193 nm wavelength immersion systems; and/or with electron beam lithographic systems. In addition, the photoresist structure 118 may exhibit any thickness permitting desired patterning of the stack structure 103 using photoresist structure 118, such as a thickness within a range of from about 1 nm to about 10,000 nm (e.g., about 10,000 nm). FIG. 4B is a top-down view of the semiconductor device structure 100 at the processing step depicted in FIG. 4A, wherein lateral boundaries of the dielectric structures 116 underlying the photoresist structure 118 are depicted with dashed lines.

The photoresist structure 118 may be formed using conventional processes including, but not limited to, PVD, CVD, ALD, and/or spin-coating. Such processes are known in the art and, therefore, are not described in detail herein.

Figure 5A:
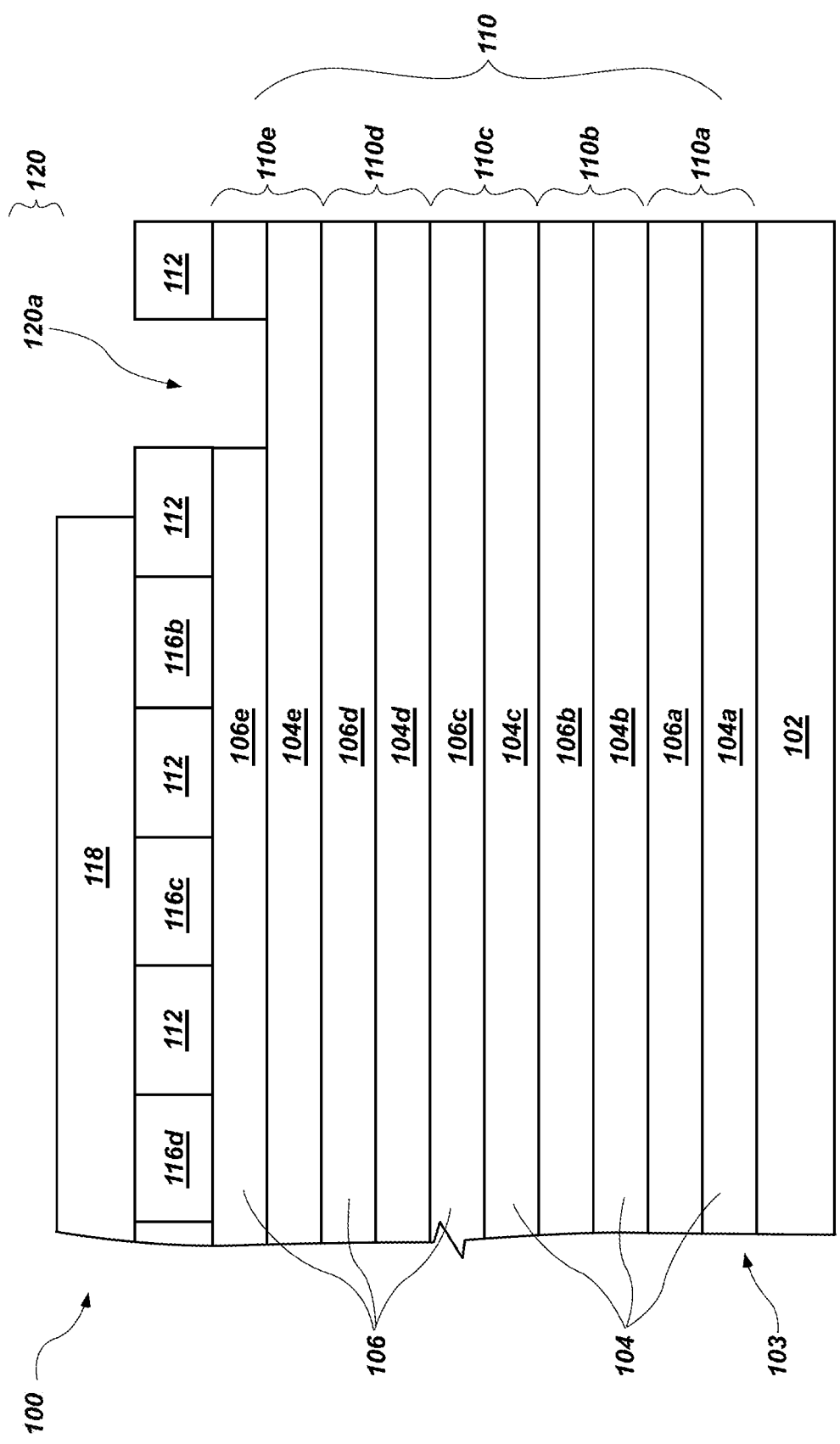
Figure 5B:
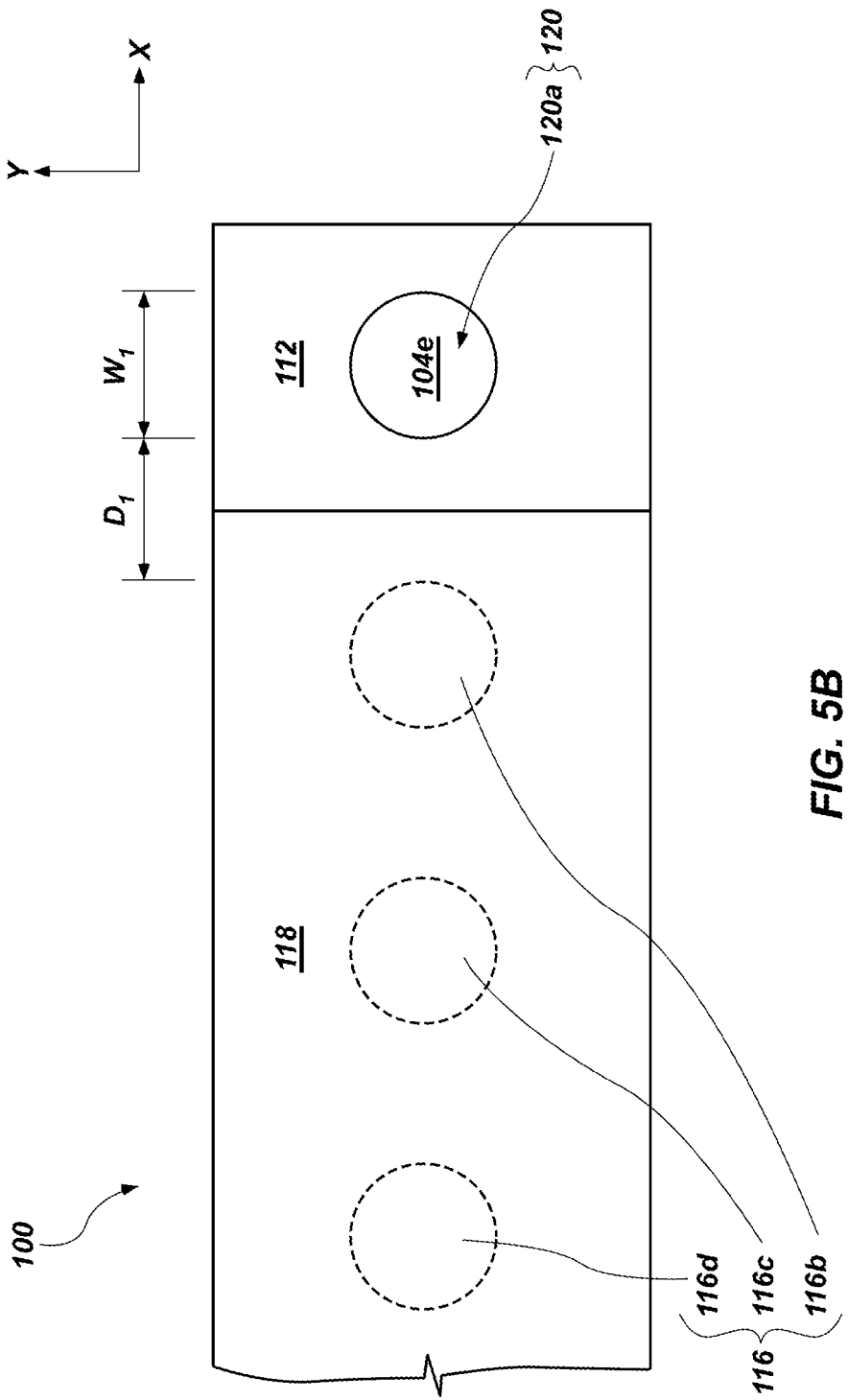

Referring next to FIG. 5A, the semiconductor device structure 100 is subjected to a first material removal process to remove (e.g., trim) a width of the photoresist structure 118 to expose (e.g., uncover) at least one of the dielectric structures 116 (FIGS. 4A and 4B), and then remove the at least one of the dielectric structures 116 and portions of at least one of the tiers 110 of the stack structure 103 thereunder to form one or more apertures 120 longitudinally extending into the stack structure 103. By way of non-limiting example, as shown in FIG. 5A, the photoresist structure 118 may be trimmed back to a location laterally intermediate (e.g., laterally between) the first dielectric structure 116a (FIGS. 4A and 4B) and the second dielectric structure 116b, and then the first dielectric structure 116a and a portion of the fifth insulating structure 106e of the fifth tier 110e of the stack structure 103 may be selectively removed to form a first aperture 120a longitudinally extending into the stack structure 103. The first aperture 120a may terminate (e.g., end, stop) at an upper surface of the fifth conductive structure 104e of the fifth tier 110e of the stack structure 103. FIG. 5B is a top-down view of the semiconductor device structure 100 at the processing step depicted in FIG. 5A, wherein lateral boundaries of the remaining dielectric structures 116 (e.g., the second dielectric structure 116b, the third dielectric structure 116c, the fourth dielectric structure 116d) underlying a remaining portion of the photoresist structure 118 are depicted with dashed lines.

The first material removal process may trim any amount of the photoresist structure 118 sufficient to substantially expose at least one of the dielectric structures 116 (FIGS. 4A and 4B). As shown in FIGS. 5A and 5B, in some embodiments, the photoresist structure 118 is trimmed to a location about midway (e.g., equidistant) between adjacent dielectric structures 116 (e.g., about midway between the first dielectric structure 116a shown in FIGS. 4A and 4B and the second dielectric structure 116b) to substantially expose one of the adjacent dielectric structures 116 (e.g., the first dielectric structure 116a shown in FIGS. 4A and 4B) while keeping the other of the adjacent dielectric structures 116 (e.g., the second dielectric structure 116b) substantially covered by a remaining portion of the photoresist structure 118. In additional embodiments, the photoresist structure 118 may be trimmed to a location more laterally proximate to one of the adjacent dielectric structures 116 than the other of the adjacent dielectric structures 116 (e.g., more laterally proximate to the first dielectric structure 116a shown in FIGS. 4A and 4B, or more laterally proximate to the second dielectric structure 116b).

The first material removal process may include photolithographically processing the photoresist structure 118 to remove the width of the photoresist structure 118, and then removing the dielectric structures 116 not covered by a remaining portion of the photoresist structure 118 as well as a portion of one or more of the tiers 110 of the stack structure 103 thereunder using at least one etching process. For example, the photoresist structure 118 may be exposed to an appropriate wavelength (e.g., 13.7 nm, 157 nm, 193 nm, 248 nm, 365 nm) of radiation through a reticle and then developed to trim the width of the photoresist structure 118 and expose (e.g., uncover) the first dielectric structure 116a (FIGS. 4A and 4B), and then the first dielectric structure 116a and a portion of the fifth insulating structure 106e of the fifth tier 110e of the stack structure 103 may be selectively removed using at least one etching process (e.g., at least one anisotropic etching process, such as an anisotropic dry etching process) to expose a portion of the fifth conductive structure 104e of the fifth tier 110e of the stack structure 103. In some embodiments, such as in embodiments wherein the etch selectivity of the dielectric material of the dielectric structures 116 (FIG. 4A) is substantially similar to the etch selectivity of the isolation material of the fifth insulating structure 106e, a single (e.g., only one) etching process may be used to remove the first dielectric structure 116a and the portion of the fifth insulating structure 106e thereunder. In additional embodiments, such as in embodiments wherein the etch selectivity of the dielectric material of the dielectric structures 116 (FIG. 4A) is different than the etch selectivity of the isolation material of the fifth insulating structure 106e, a first etching process may be used to remove the first dielectric structure 116a and then a second etching process may be used to remove the portion of the fifth insulating structure 106e thereunder. Process parameters (e.g., radiation wavelengths, developers, etchants, exposure times) of the first material removal process may be tailored to the configurations (e.g., material compositions, material distributions, thicknesses, arrangements) of the photoresist structure 118, the patterned hard mask structure 112, and the stack structure 103 (including the configurations of the conductive structures 104 and the insulating structures 106 thereof).

Figure 6A:
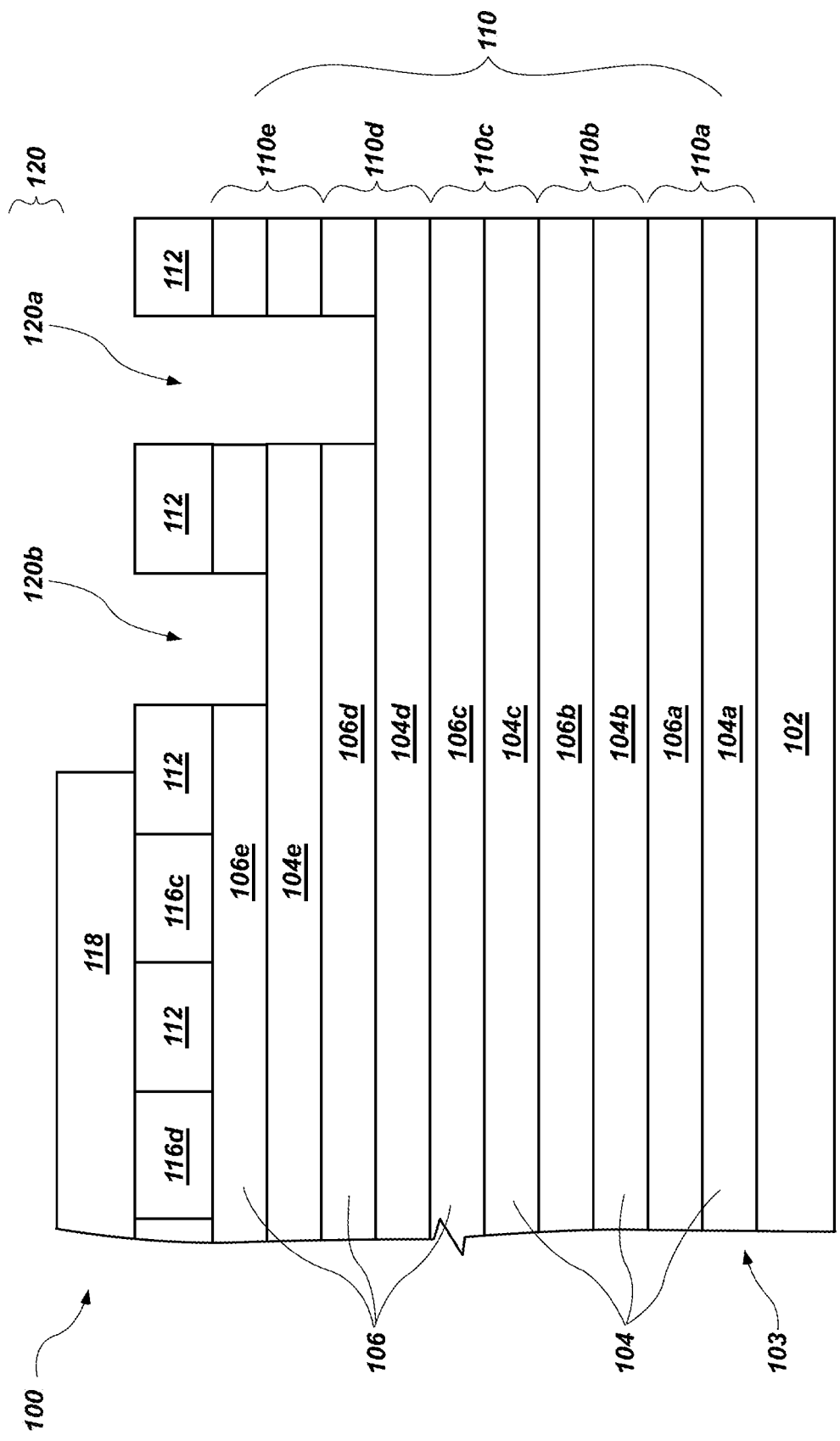
Figure 6B:
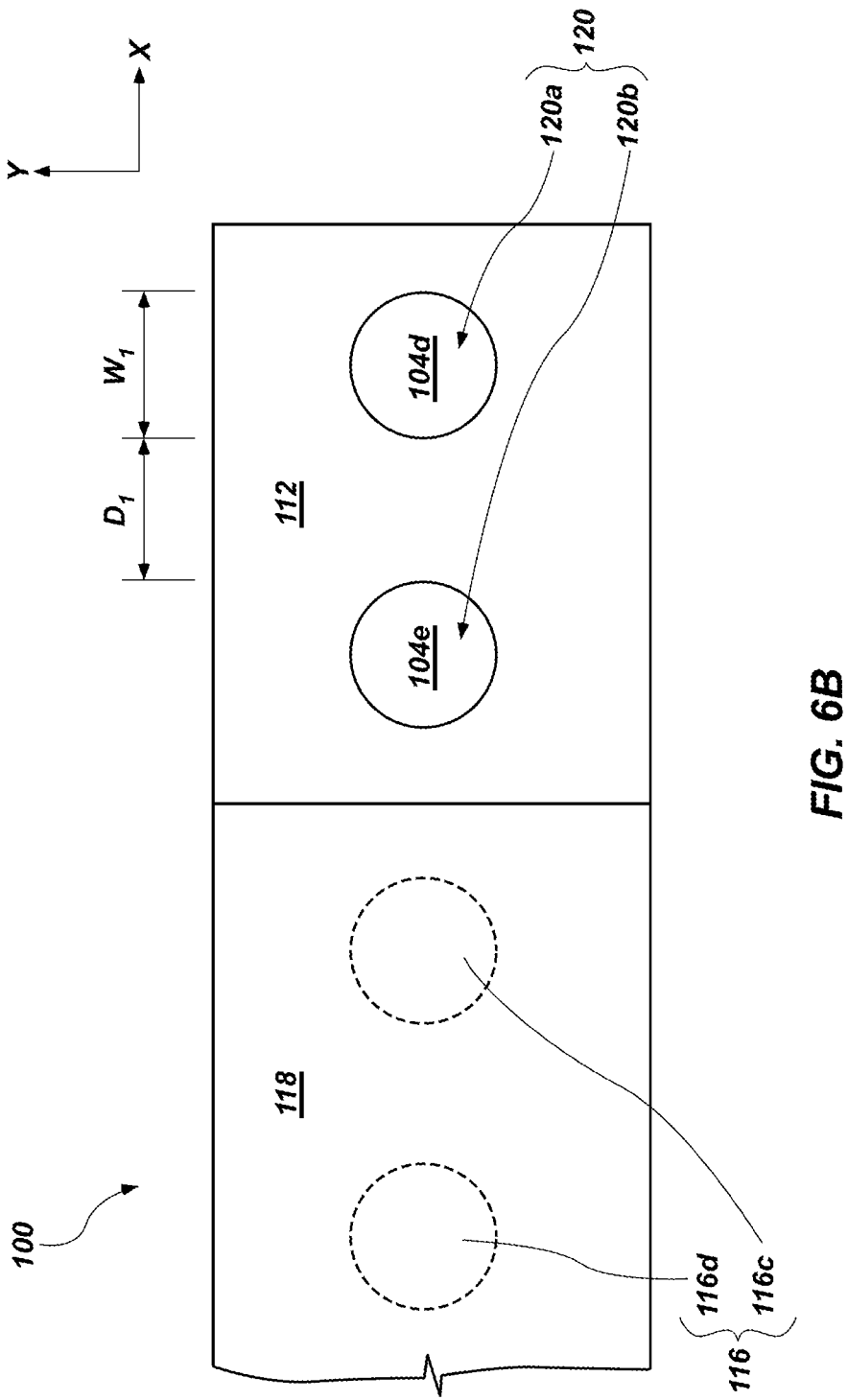

Referring next to FIG. 6A, the semiconductor device structure 100 may be subjected to a second material removal process to remove (e.g., trim) another width of the photoresist structure 118 to expose (e.g., uncover) at least one other of the dielectric structures 116 (FIGS. 4A and 4B), remove the at least one other of the dielectric structures 116, and remove portions of at least two of the tiers 110 of the stack structure 103 to increase the number of apertures 120 longitudinally extending into the stack structure 103 and increase the depth(s) of the aperture(s) 120 previously formed in the stack structure 103 (e.g., through the first material removal process). By way of non-limiting example, as shown in FIG. 6A, the photoresist structure 118 may be trimmed back to a location laterally intermediate (e.g., laterally between) the second dielectric structure 116b (FIGS. 5A and 5B) and the third dielectric structure 116c; portions of the fifth conductive structure 104e of the fifth tier 110e of the stack structure 103 and of the fourth insulating structure 106d of the fourth tier 110d of the stack structure 103 underlying the first aperture 120a may be selectively removed to increase the depth of the first aperture 120a; and the second dielectric structure 116b and a portion of the fifth insulating structure 106e of the fifth tier 110e underlying the second dielectric structure 116b may be selectively removed to form a second aperture 120b longitudinally extending into the stack structure 103. The first aperture 120a, as longitudinally extended during the second material removal process, may terminate at an upper surface of the fourth conductive structure 104d of the fourth tier 110d of the stack structure 103. The second aperture 120b, as formed during the second material removal process, may terminate at an upper surface of the fifth conductive structure 104e of the fifth tier 110e of the stack structure 103. FIG. 6B is a top-down view of the semiconductor device structure 100 at the processing step depicted in FIG. 6A, wherein lateral boundaries of the remaining dielectric structures 116 (e.g., the third dielectric structure 116c, the fourth dielectric structure 116d) underlying a remaining portion of the photoresist structure 118 are depicted with dashed lines.

The second material removal process may trim any amount of the photoresist structure 118 remaining following the first material removal process sufficient to substantially expose at least one of the dielectric structures 116 (FIGS. 4A and 4B) remaining after the first material removal process. As shown in FIGS. 6A and 6B, in some embodiments, the photoresist structure 118 is trimmed to a location about midway (e.g., equidistant) between remaining adjacent dielectric structures 116 (e.g., about midway between the second dielectric structure 116b shown in FIGS. 5A and 5B and the third dielectric structure 116c) to substantially expose one of the remaining adjacent dielectric structures 116 (e.g., the second dielectric structure 116b shown in FIGS. 5A and 5B) while keeping the other of the remaining adjacent dielectric structures 116 (e.g., the third dielectric structure 116c) substantially covered by a further remaining portion of the photoresist structure 118. In additional embodiments, the photoresist structure 118 may be trimmed to a location more laterally proximate to one of the remaining adjacent dielectric structures 116 than the other of the adjacent dielectric structures 116 (e.g., more laterally proximate to the second dielectric structure 116b shown in FIGS. 5A and 5B, or more laterally proximate to the third dielectric structure 116c).

The second material removal process may include photolithographically processing the photoresist structure 118 remaining following the first material removal process to remove an additional width of the photoresist structure 118; removing exposed portions of one or more of the conductive structures 104 using an etching process; and removing exposed dielectric structures 116, and portions of the insulating structures 106 uncovered following the removal of the exposed dielectric structures 116 and the exposed portions of the conductive structures 104 using another etching process. For example, the photoresist structure 118 may be exposed to an appropriate wavelength of radiation through a reticle and then developed to trim the additional width from the photoresist structure 118 and expose the second dielectric structure 116b (FIGS. 5A and 5B); a portion of the fifth conductive structure 104e of the fifth tier 110e of the stack structure 103 may be selectively removed using at least one etching process (e.g., at least one anisotropic etching process, such as an anisotropic dry etching process) to expose a portion of the fourth insulating structure 106d of the fourth tier 110d of the stack structure 103; and the second dielectric structure 116b, a portion of the fifth insulating structure 106e of the fifth tier 110e of the stack structure 103 underlying the second dielectric structure 116b, and the exposed portion of the fourth insulating structure 106d may be selectively removed using at least one other etching process (e.g., at least one other anisotropic etching process, such as another anisotropic dry etching process) to expose another portion of the fifth conductive structure 104e and a portion of the fourth conductive structure 104d. The portion of the fifth conductive structure 104e may be removed before or after the removal of the additional width of the photoresist structure 118, and may be removed prior to removing the second dielectric structure 116b and the portions of the fifth insulating structure 106e and the fourth insulating structure 106d. In addition, a single (e.g., only one) etching process may be used to remove the second dielectric structure 116b and the portions of the fifth insulating structure 106e and the fourth insulating structure 106d, or a first etching process may be used to remove the second dielectric structure 116b and then a second etching process may be used to remove the portions of the fifth insulating structure 106e and the fourth insulating structure 106d. The portions of the fifth insulating structure 106e and the fourth insulating structure 106d may be removed substantially simultaneously. Process parameters (e.g., radiation wavelengths, developers, etchants, exposure times) of the second material removal process may be tailored to the configurations (e.g., material compositions, material distributions, thicknesses, arrangements) of the photoresist structure 118, the patterned hard mask structure 112, and the stack structure 103 (including the configurations of the conductive structures 104 and the insulating structures 106 thereof).

Figure 7A:
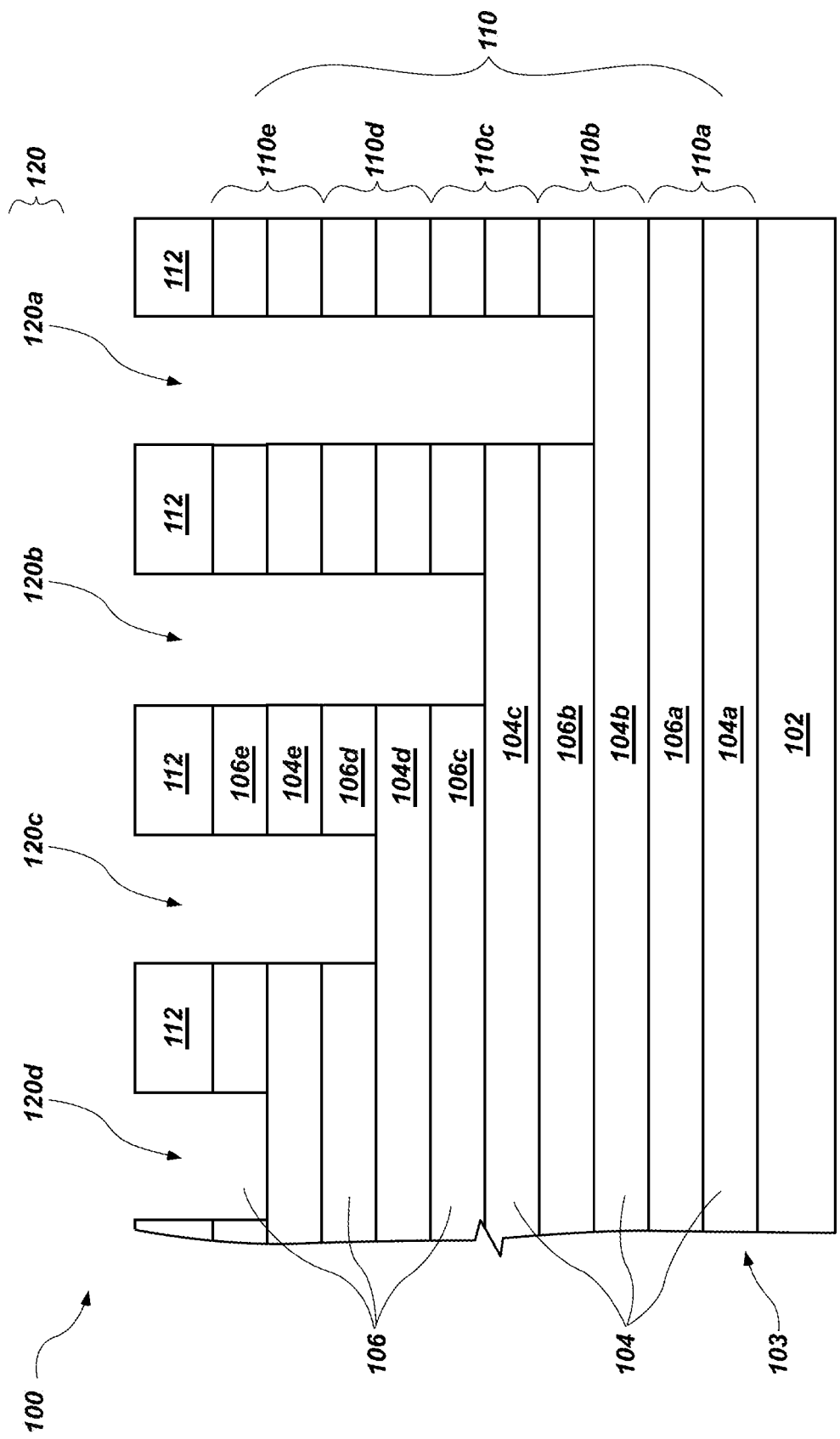
Figure 7B:
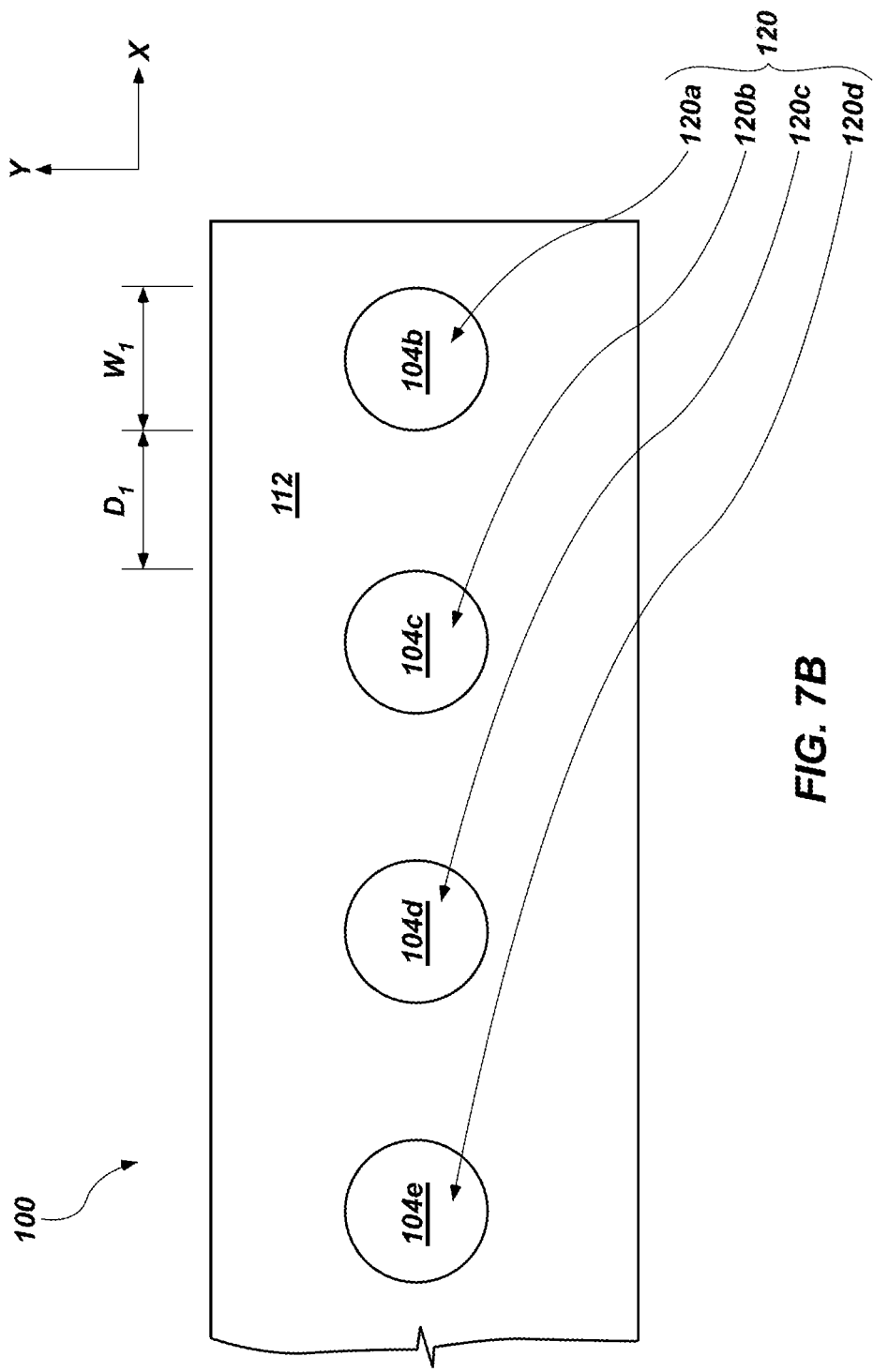

Referring next to FIG. 7A, the semiconductor device structure 100 may be subjected to additional material removal processes to remove (e.g., trim) additional portions of the photoresist structure 118, the insulating structures 106, and the conductive structures 104 to further increase the number of apertures 120 longitudinally extending into the stack structure 103 and to further increase the depth of apertures 120 previously formed in the stack structure 103 (e.g., through the first material removal process and the second material removal process). For example, as shown in FIG. 7A, the additional material removal processes may increase the depths of the first aperture 120a and the second aperture 120b within the stack structure 103, and may also form a third aperture 120c and a fourth aperture 120d within the stack structure 103. The apertures 120 may extend to different depths within the stack structure 103 than one another. The apertures 120 may, for example, longitudinally extend to different conductive structures 104 of the stack structure 103 than one another. By way of non-limiting example, following the additional material removal processes, the first aperture 120a may longitudinally extend to an upper surface of the second conductive structure 104b of the second tier 110b of the stack structure 103, the second aperture 120b may longitudinally extend to an upper surface of the third conductive structure 104c of the third tier 110c of the stack structure 103, the third aperture 120c may longitudinally extend to an upper surface of the fourth conductive structure 104d of the fourth tier 110d of the stack structure 103, and the fourth aperture 120d may longitudinally extend to an upper surface of the fifth conductive structure 104e of the fifth tier 110e of the stack structure 103. FIG. 7B is a top-down view of the semiconductor device structure 100 at the processing step depicted in FIG. 7A.

While various embodiments herein are described and illustrated for clarity in the context of the semiconductor device structure 100 as being formed to include four (4) apertures 120 longitudinally extending to different depths within the stack structure 103, the semiconductor device structure 100 may, alternatively, be formed to include a different number of apertures 120 and/or one or more of the apertures 120 may longitudinally extend to different depths than those depicted in FIG. 7A. In some embodiments, the number of apertures 120 formed directly corresponds to (e.g., is the same as) the number of conductive structures 104 included in the stack structure 103. By way of non-limiting example, if the stack structure 103 is formed to include fifty (50) of the conductive structures 104, fifty (50) apertures 120 may be formed in the semiconductor device structure 100. In additional embodiments, the number of apertures 120 formed may be different than (e.g., less than, or greater than) the number of conductive structures 104 included in the stack structure 103. By way of non-limiting example, if the stack structure 103 is formed to include fifty (50) conductive structures 104, less than fifty (50) apertures 120 (e.g., less than or equal to forty-nine (49) apertures 120) may be formed in the semiconductor device structure 100, or greater than fifty (50) apertures 120 (e.g., greater than or equal to fifty-one (51) apertures 120) may be formed in the semiconductor device structure 100. Each of the apertures 120 may longitudinally extend to a different one of the conductive structures 104 of the stack structure 103 than each other of the apertures 120, or at least some (e.g., two or more) of the apertures 120 may longitudinally extend to one or more of the same conductive structures 104 of the stack structure 103.

The additional material removal processes may include photolithographically processing the photoresist structure 118 remaining following previous material removal processes (e.g., the first material removal process, the second material removal process) to remove an additional width of the photoresist structure 118; removing exposed portions of the conductive structures 104 using one or more etching processes (e.g., one or more anisotropic etching processes, such as one or more anisotropic dry etching processes); and removing exposed dielectric structures 116, and portions of the insulating structures 106 uncovered following the removal of the exposed dielectric structures 116 and the exposed portions of the conductive structures 104 using one or more other etching processes (e.g., one or more other anisotropic etching processes, such as one or more other anisotropic dry etching processes). Process parameters (e.g., radiation wavelengths, developers, etchants, exposure times) of the additional material removal processes may be tailored to the configurations (e.g., material compositions, material distributions, thicknesses, arrangements) of the photoresist structure 118, the patterned hard mask structure 112, and the stack structure 103 (including the configurations of the conductive structures 104 and the insulating structures 106 thereof). Duration(s) and/or end-point scheme(s) for one or more of the additional material removal processes may be substantially the same as or may be different than duration(s) and/or end-point scheme(s) for one or more of the first material removal process, the second material removal process, and one or more other of the additional material removal processes.

Figure 8A:
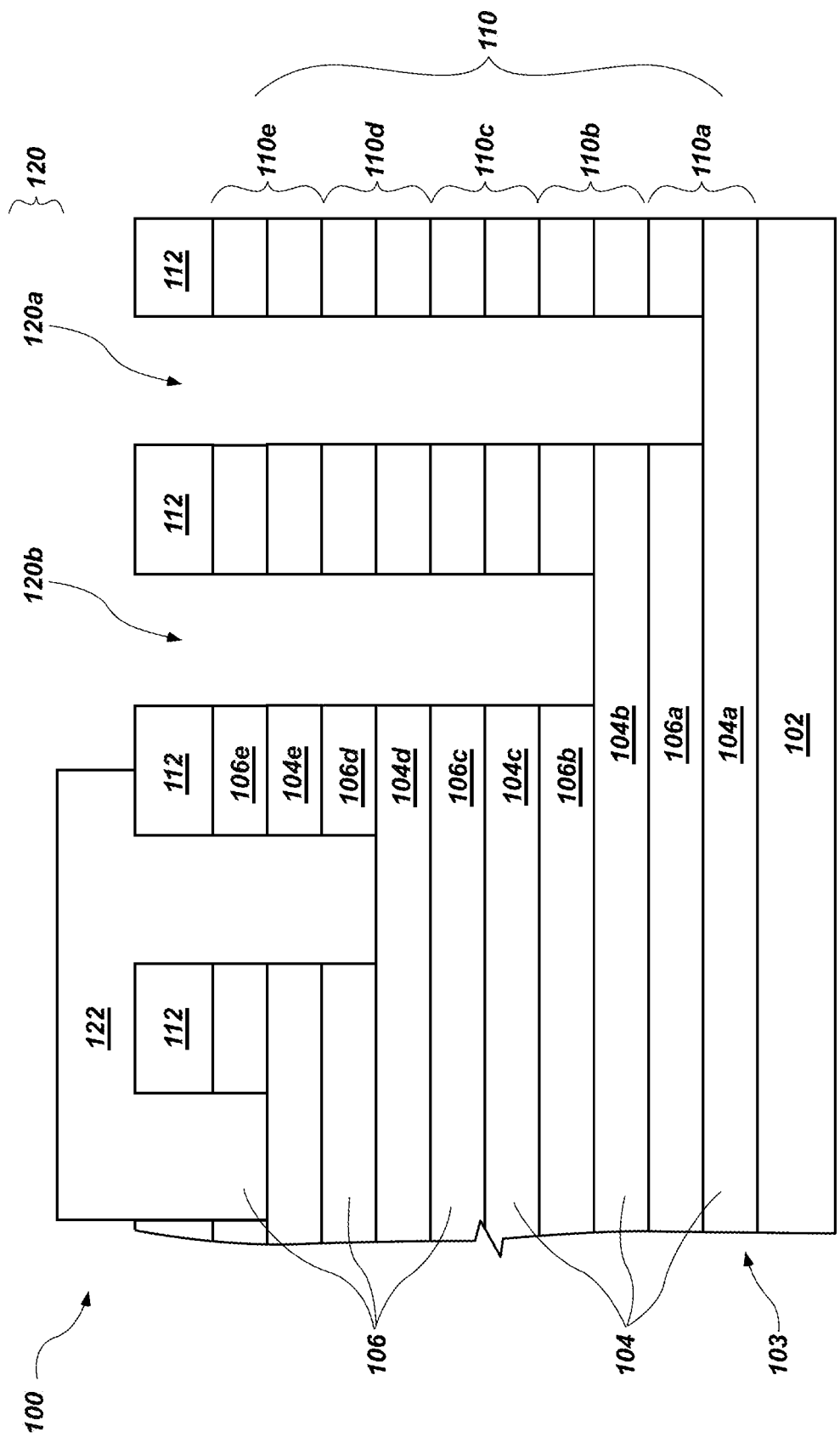
Figure 8B:
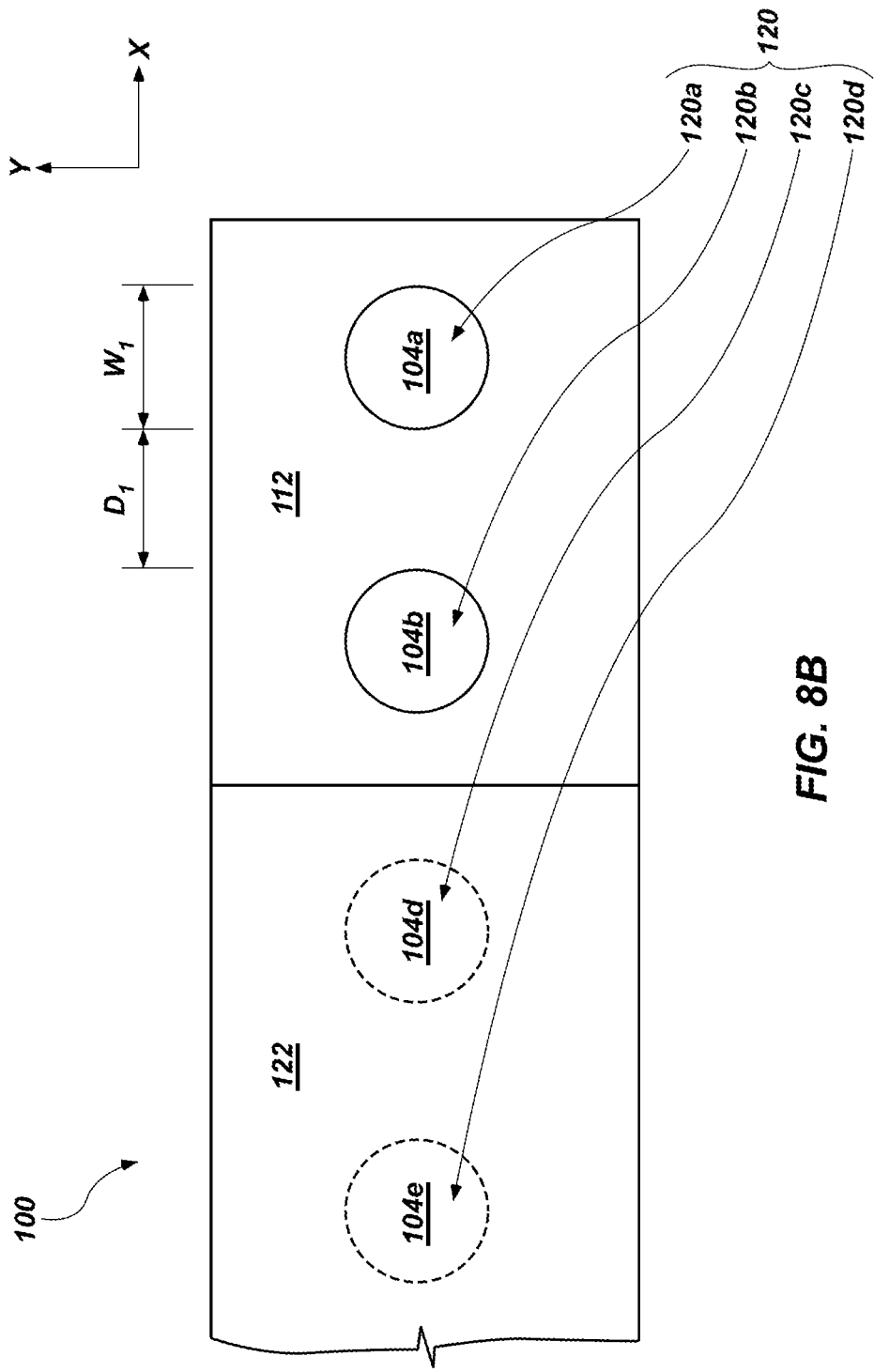

Referring next to FIG. 8A, optionally, one or more of the apertures 120 may be at least partially (e.g., substantially) filled with a masking material 122, and then the semiconductor device structure 100 may be subjected to one or more other material removal processes (e.g., one or more chopping processes) to increase the depth(s) of one or more other of the aperture(s) 120 remaining unfilled with the masking material 122. For example, the masking material 122 may be disposed within the third aperture 120c (FIG. 7A) and the fourth aperture 120d (FIG. 7A), and then the longitudinal depth of the first aperture 120a and the second aperture 120b may be increased using at least one additional material removal process. As shown in FIG. 8A, the first aperture 120a may be longitudinally extended to terminate at an upper surface of the first conductive structure 104a of the first tier 110a of the stack structure 103, and the second aperture 120b may be longitudinally extended to terminate at an upper surface of the second conductive structure 104b of the second tier 110b of the stack structure 103. The masking material 122 may substantially protect portions of the stack structure 103 underlying the third aperture 120c and the fourth aperture 120d from being removed during the one or more other material removal processes. FIG. 8B is a top-down view of the semiconductor device structure 100 at the optional processing step depicted in FIG. 8A.

The masking material 122, if any, may be formed of and include a material facilitating the selective removal of portions of the stack structure 103 (e.g., portions of the tiers 110 of the conductive structures 104 and the insulating structures 106) underlying apertures 120 (e.g., the first aperture 120a, the second aperture 120b) remaining substantially free of (e.g., substantially unfilled with) the masking material 122. By way of non-limiting example, the masking material 122 may be formed of and include a conventional photoresist material, such as a conventional positive tone photoresist material, or a conventional negative tone photoresist material. Suitable photoresist materials (e.g., positive tone photoresist materials, negative tone photoresist materials) are known in the art, and are, therefore, not described in detail herein.

The masking material 122, if any, may be formed to fill any desired number (e.g., quantity) of the apertures 120 less than the total number of the apertures 120. Which apertures 120 are filled with the masking material 122 (and, hence, which apertures 120 are longitudinally extended by the one or more other material removal processes) may be selected based on desired configurations of contact structures to be subsequently formed within the apertures 120, as described in further detail below. While various embodiments herein are described and illustrated for clarity in the context of the masking material 122 as being formed to fill two (2) of the apertures 120, the masking material 122 may, alternatively, be formed to fill a different number of apertures 120, such as greater than two (2) of the apertures 120 or less than two (2) of the apertures 120. As shown in FIG. 8A, in some embodiments, the masking material 122 is formed on or over surfaces (e.g., surfaces of the stack structure 103, surfaces of the patterned hard mask structure 112) within the apertures 120, and on or over surfaces (e.g., additional surfaces of the patterned hard mask structure 112) outside of the boundaries of the apertures 120. In additional embodiments, the masking material 122 is substantially confined with the boundaries (e.g., lateral boundaries, longitudinal boundaries) of the apertures 120. The processing step depicted in FIGS. 8A and 8B may permit subsequently formed contact structures to be provided in electrical connection with each of the tiers 110 of the stack structure 103 with fewer of the processing (e.g., photoresist structure 118 trimming and stack structure 103 etching) steps previously collectively described with respect to FIGS. 5A through 7B. In further embodiments, the processing step depicted in FIGS. 8A and 8B is omitted, and the masking material 122 is absent from each of the apertures 120.

The masking material 122, if any, may be selectively formed within one or more of the apertures 120 using conventional processes (e.g., conventional deposition processes, conventional photoexposure processes, conventional development processes) and conventional processing equipment, which are not described in detail herein. In addition, portions of the stack structure 103 underlying the apertures 120 remaining unfilled with the masking material 122 may be selectively removed using one or more additional conventional processes (e.g., one or more conventional anisotropic etching processes, such as one or more conventional anisotropic dry etching processes) and conventional processing equipment, which are also not described in detail herein.

Figure 9A:
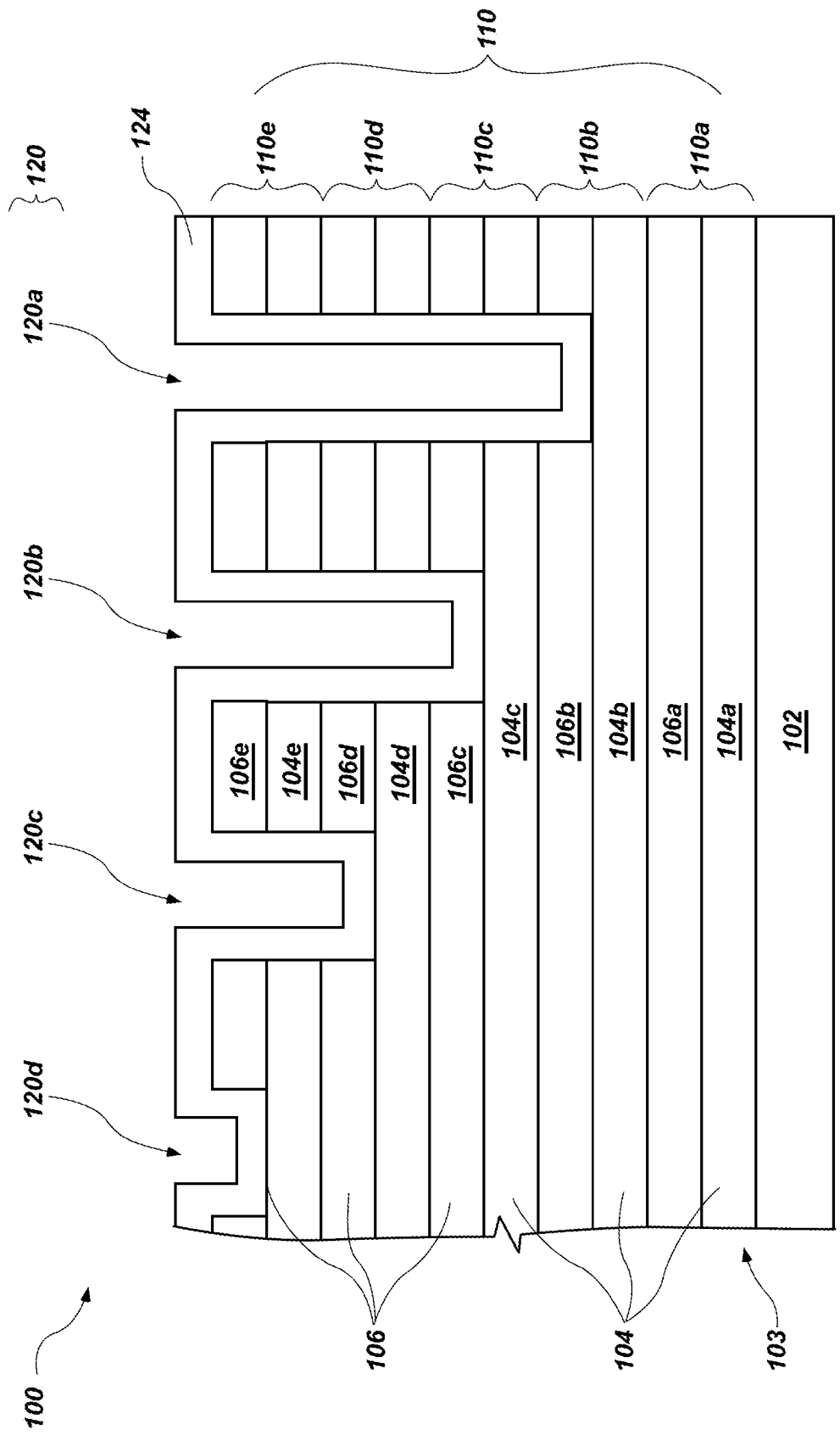

Referring next to FIG. 9A, the patterned hard mask structure 112 (FIG. 7A) and, if present, the masking material 122 (FIG. 8A) may be selectively removed, and a dielectric material 124 may be formed on or over exposed surfaces of the stack structure 103 (e.g., exposed surfaces of the conductive structures 104 and the insulating structures 106). As shown in FIG. 9A, the dielectric material 124 may extend continuously across the semiconductor device structure 100, and may partially (e.g., less than completely) fill the apertures 120 in the stack structure 103. FIG. 9B is a top-down view of the semiconductor device structure 100 at the processing step depicted in FIG. 9A.

The patterned hard mask structure 112 (FIG. 7A) and the masking material 122 (FIG. 8A, if present) may be removed using conventional processes and conventional processing equipment, which are not described in detail herein. For example, the patterned hard mask structure 112 may be removed using at least one conventional CMP process, and the masking material 122 (if any) may be removed using at least one conventional photoresist development process. In additional embodiments, the patterned hard mask structure 112 is not removed prior to forming the dielectric material 124. For example, the patterned hard mask structure 112 may be substantially maintained, such that the dielectric material 124 is formed on or over exposed surfaces of the patterned hard mask structure 112, and on or over exposed surfaces of the patterned hard mask structure 112. In such embodiments, the patterned hard mask structure 112 may be removed (e.g., using one or more conventional CMP processes) following the formation of the dielectric material 124, or may be at least partially (e.g., substantially) maintained in the semiconductor device structure 100 even after the completion of all other desired processing acts.

The dielectric material 124 may be formed of and include an oxide material (e.g., silicon dioxide, phosphosilicate glass, borosilicate glass, borophosphosilicate glass, fluorosilicate glass, aluminum oxide, a combination thereof), a nitride material (e.g., silicon nitride), an oxynitride material (e.g., silicon oxynitride), amphorous carbon, or a combination thereof. In some embodiments, the dielectric material 124 is silicon dioxide. The dielectric material 124 may be formed at any suitable thickness. The thickness of the dielectric material 124 may be selected (e.g., tailored) to provide electrical isolation between contact structures to be subsequently formed within the remaining (e.g., unfilled) portions of the apertures 120 and some of the conductive structures 104 of the stack structure 103. By way of non-limiting example, the thickness of the dielectric material 124 may be less than or equal to about 200 nm (e.g., less than or equal to about 100 nm, less than or equal to about 50 nm). In some embodiments, the thickness of the dielectric material 124 is less than or equal to about 100 nm. The thickness of the dielectric material 124 may be substantially uniform, or at least one region of the dielectric material 124 may have a different thickness than at least one other region of the dielectric material 124. The dielectric material 124 may be formed using conventional processes (e.g., conventional deposition processes, such as one or more of a PVD process, a CVD process, and an ALD process) and conventional processing equipment, which are not described in detail herein.

Figure 10A:
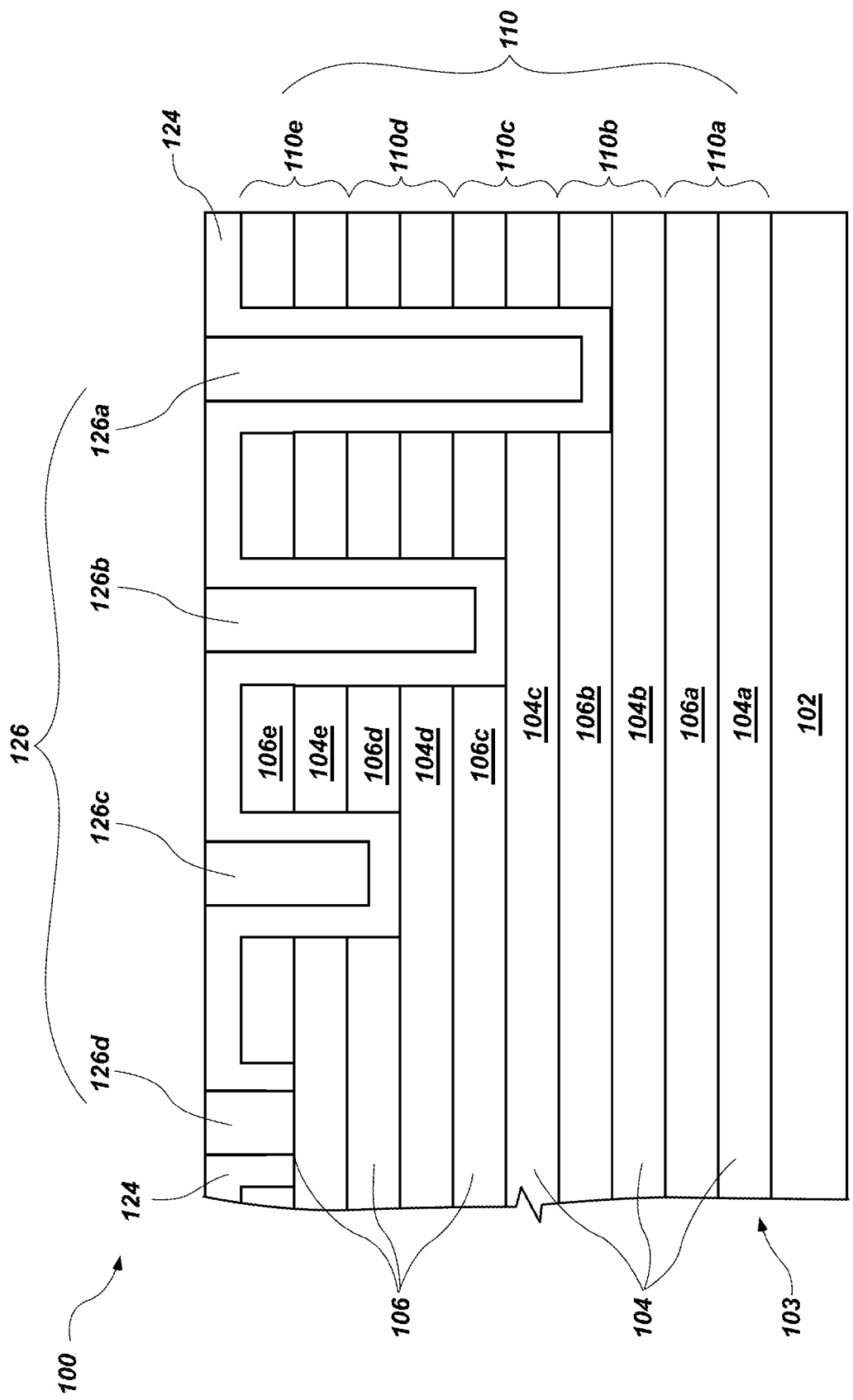

Referring next to FIG. 10A, portions of the dielectric material 124 at the bottoms (e.g., lower ends) of the apertures 120 (FIG. 9A) may be removed, and contact structures 126 (e.g., plugs, vertical interconnections) may be formed within the apertures 120 to provide electrical contact to the conductive structures 104 of the tiers 110 of the stack structure 103. The contact structures 126 may be coupled to portions of the conductive structures 104 defining the bottoms of the apertures 120 following the removal of the portions of the dielectric material 124, and may occupy volumes of the apertures 120 unoccupied by remaining portions of the dielectric material 124. Each of the contact structures 126 may directly contact the conductive structure 104 defining the bottom of the aperture 120 associated therewith, and remaining portions of the dielectric material 124 may laterally intervene between the contact structure 126 and the conductive structures 104 partially defining the sides of the aperture 120 associated therewith. For example, as shown in FIG. 10A, a first contact structure 126a may be formed on a portion of the second conductive structure 104b defining a bottom of the first aperture 120a (FIG. 9A), a second contact structure 126b may be formed on a portion of the third conductive structure 104c defining a bottom of the second aperture 120b (FIG. 9A), a third contact structure 126c may be formed on a portion of the fourth conductive structure 104d defining a bottom of the third aperture 120c (FIG. 9A), and a fourth contact structure 126d may be formed on a portion of the fifth conductive structure 104e defining a bottom of the fourth aperture 120d (FIG. 9A). FIG. 10B is a top-down view of the semiconductor device structure 100 at the processing step depicted in FIG. 10A.

While various embodiments herein are described and illustrated for clarity in the context of the semiconductor device structure 100 as being formed to include four (4) contact structures 126, the semiconductor device structure 100 may, alternatively, be formed to include a different number of contact structures 126. The number of contact structures 126 formed may directly correspond to the number of apertures 120 (FIGS. 9A and 9B) (e.g., which may be the same as the number of tiers 110 of the stack structure 103, or may be different than the number of tiers 110 of the stack structure 103). By way of non-limiting example, if the semiconductor device structure 100 is formed to include fifty (50) apertures 120, the semiconductor device structure 100 may also be formed to include fifty (50) contact structures 126 within the fifty (50) apertures 120.

The contact structures 126 may be formed of and include at least one conductive material, such as a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. Each of the contact structures 126 have substantially the same material composition, or at least one of the contact structures 126 may have a different material composition than at least one other of the contact structures 126.

In some embodiments, the contact structures 126 exhibit substantially the same lateral geometric configurations (e.g., substantially the same lateral cross-sectional shape and substantially the same lateral dimensions) as one another, are regularly (e.g., uniformly, non-variably) laterally spaced apart (e.g., laterally separated, laterally distanced) from one another, and are substantially laterally aligned with one another. For example, as shown in FIG. 10B, each of the contact structures 126 may exhibit a substantially circular lateral cross-sectional shape, may have substantially the same width $W_3$ (e.g., diameter), may be laterally spaced apart in the X-direction from each other of the contact structures 126 laterally adjacent thereto by substantially the same distance $D_3$, and may be substantially laterally aligned in the Y-direction with each other of the contact structures 126. The width $W_3$ of each of the contact structures 126 may, for example, be less than or equal to about 300 nm (e.g., less than or equal to about 200 nm, less than or equal to about 100 nm). In some embodiments, the width $W_3$ of each of the contact structures 126 is about 100 nm. In addition, the distance $D_3$ between laterally adjacent contact structures 126 may, for example, be less than or equal to about 1500 nm (e.g., less than or equal to about 1000 nm, less than or equal to about 800 nm, less than or equal to about 500 nm, less than or equal to about 400 nm, less than or equal to about 300 nm). In some embodiments, the distance $D_3$ between laterally adjacent contact structures 126 is about 500 nm. The lateral geometric configuration (e.g., lateral cross-sectional shape, lateral dimensions), lateral position (e.g., in the X-direction and the Y-direction), and lateral spacing of each of the contact structures 126 at least partially depends on the lateral geometric configuration, lateral position, and lateral spacing of the previously formed openings 114 (FIGS. 2A and 2B) in the patterned hard mask structure 112 (FIGS. 2A and 2B).

Figure 10C:
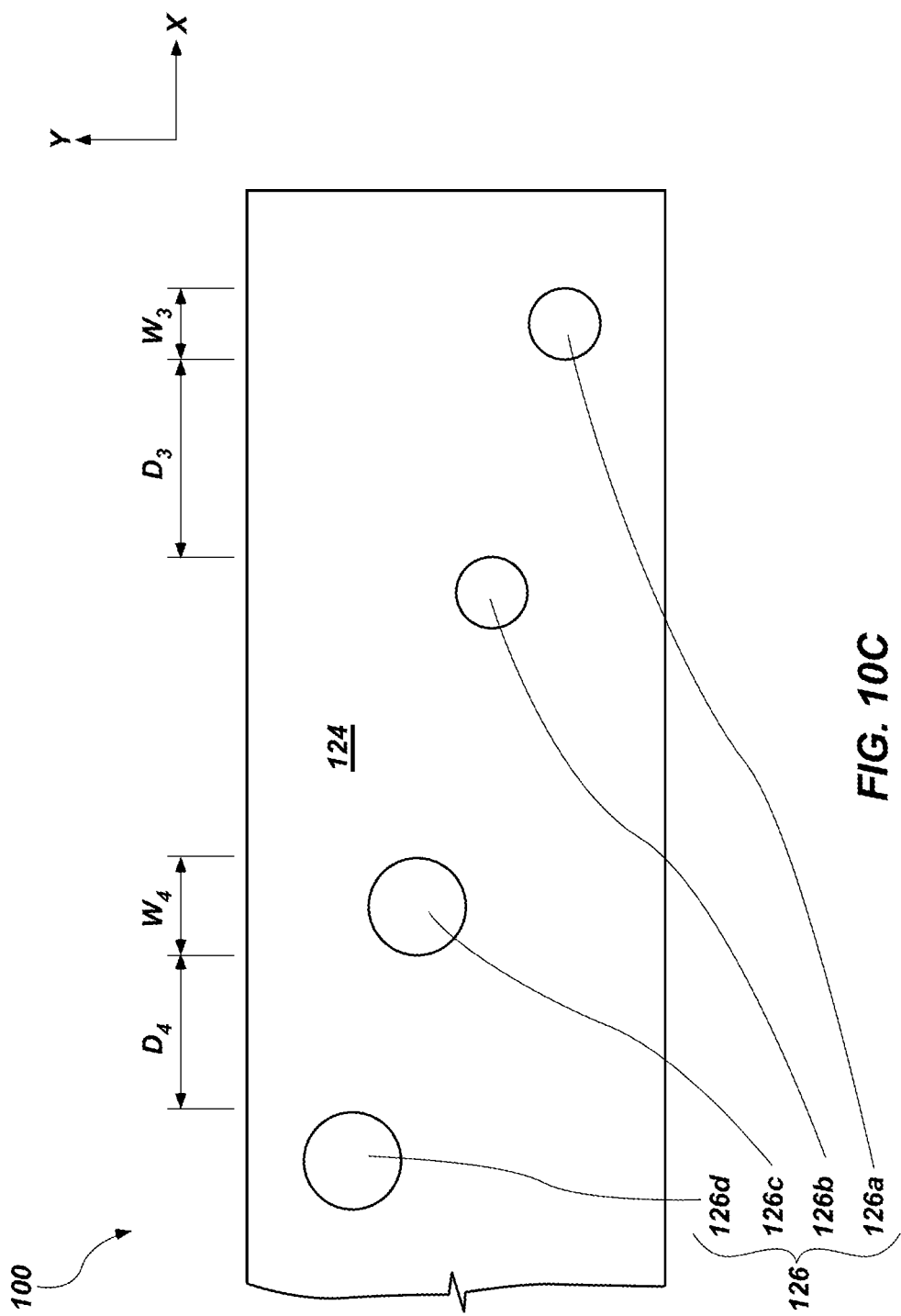

In additional embodiments, the semiconductor device structure 100 may be formed to exhibit a different configuration of the contact structures 126 than that depicted in FIG. 10B. By way of non-limiting example, one or more of the contact structures 126 may exhibit a different lateral geometric configuration (e.g., a different lateral cross-sectional shape, such as a non-circular lateral cross-sectional shape; and/or different lateral dimensions, such as a smaller width or a larger width) than one or more other of the contact structures 126, the contact structures 126 may be non-regularly (e.g., non-uniformly, variably) laterally spaced apart from one another, and/or one or more of the contact structures 126 may be substantially laterally unaligned with (e.g., laterally offset from) other of the contact structures 126. For example, as shown in the FIG. 10C, which shows a top down view of the semiconductor device structure 100 at the processing stage depicted in FIG. 10A in accordance with additional embodiments of the disclosure, one or more of the contact structures 126 may exhibit a first width $W_3$, and one or more other of the contact structures 126 may exhibit a second width $W_4$ different than (e.g., larger than, smaller than) the first width $W_3$. As another example, as also shown in FIG. 10C, one or more other of the contact structures 126 may be laterally separated in the X-direction from one or more adjacent contact structures 126 by a first distance $D_3$, and one or more of other of the contact structures 126 may be laterally separated in the X-direction from one or more other adjacent contact structures 126 by a second distance D₄ different than (e.g., less than, greater than) the first distance D₃. As a further example, as also shown in FIG. 10C, one or more (e.g., each) of the contact structures 126 may be laterally offset in the Y-direction from one or more other of the contact structures 126.

The contact structures 126 may be formed and coupled with the conductive structures 104 of the tiers 110 of the stack structure 103 through conventional processes (e.g., conventional material deposition processes, conventional material removal processes), which are not described in detail herein. By way of non-limiting example, openings (e.g., vias, apertures) may be formed (e.g., etched) through the dielectric material 124 at the bottoms (e.g., lower ends) of the apertures 120 (FIG. 9A) to expose contact regions of the underlying conductive structures 104, and then regions (e.g., volumes, open spaces) of the apertures 120 not occupied by remaining portions of the dielectric material 124 may be filled with a conductive material to form the contact structures 126.

Thus, in accordance with embodiments of the disclosure, a method of forming a semiconductor device structure comprises forming a stack structure comprising stacked tiers. Each of the stacked tiers comprises a first structure comprising a first material and a second structure comprising a second, different material longitudinally adjacent the first structure. A patterned hard mask structure is formed over the stack structure. Dielectric structures are formed within openings in the patterned hard mask structure. A photoresist structure is formed over the dielectric structures and the patterned hard mask structure. The photoresist structure, the dielectric structures, and the stack structure are subjected to a series of material removal processes to selectively remove portions of the photoresist structure, portions of the dielectric structures not covered by remaining portions of the photoresist structure, and portions of the stack structure not covered by one or more of the patterned hard mask structure and the remaining portions of the photoresist structure to form apertures extending to different depths within the stack structure. Dielectric structures are formed over side surfaces of the stack structure within the apertures. Conductive contact structures are formed to longitudinally extend to bottoms of the apertures.

Furthermore, in accordance with additional embodiments of the disclosure, a semiconductor device structure comprises a stack structure comprising alternating conductive structures and insulating structures arranged in stacked tiers overlying a substrate, and filled apertures longitudinally extending to different depths within the stack structure. Each of the stacked tiers individually comprises one of the conductive structures and one of the insulating structures. The stack structure is free of stair step structures defined by edges of the stacked tiers. Each of the filled apertures individually comprises at least one dielectric structure substantially covering side surfaces of the stack structure, and at least one conductive contact structure laterally inwardly adjacent the at least one dielectric structure and coupled to one of the conductive structures of the stack structure.

Figure 11:
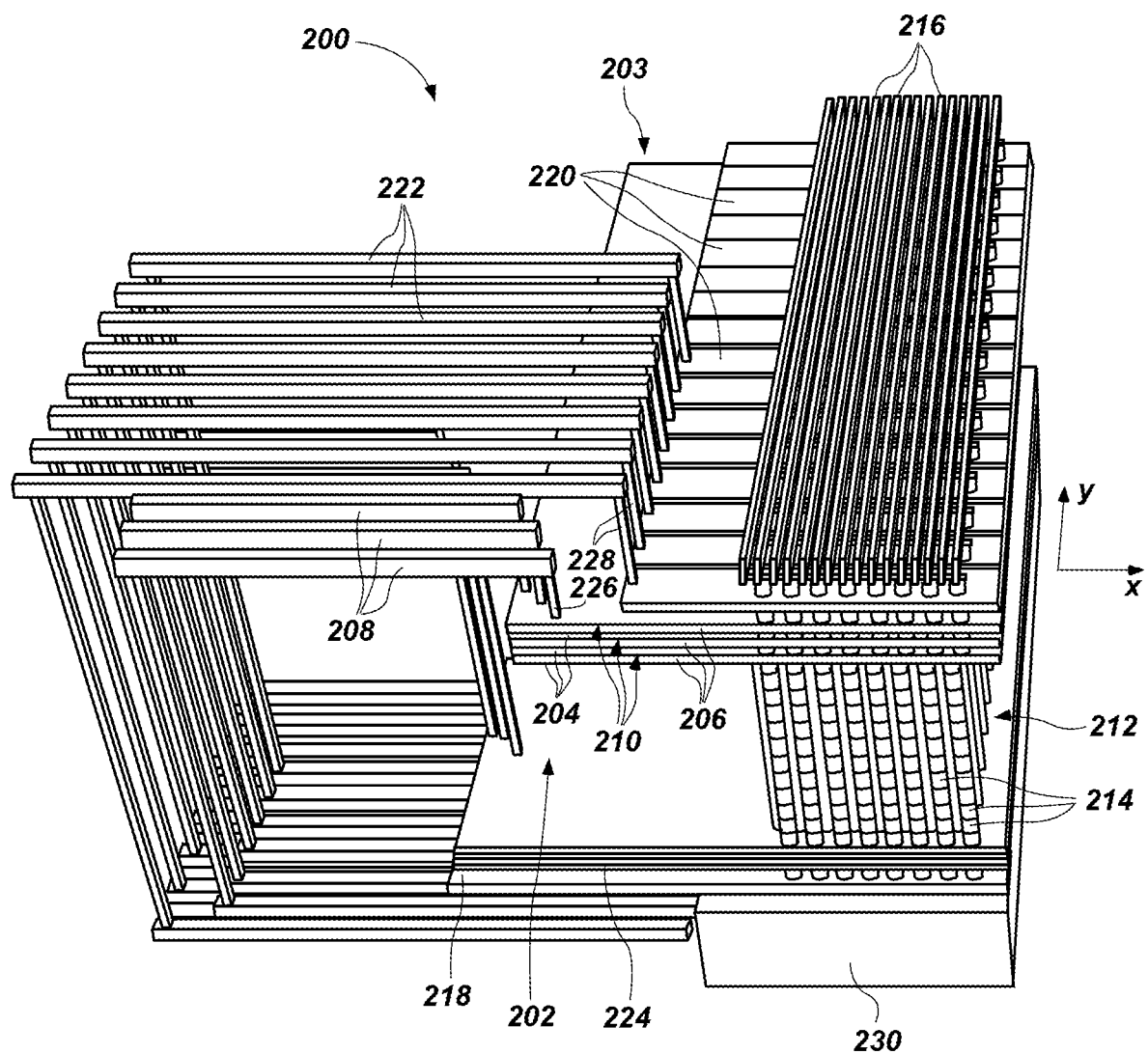
FIG. 11 is a partial cutaway perspective view of a vertical memory device including a semiconductor device structure having a stair step structure, in accordance with an embodiment of the disclosure.

FIG. 11 illustrates a partial cutaway perspective view of a portion of a semiconductor device 200 (e.g., a vertical memory device, such as a 3D NAND Flash memory device) including at least one semiconductor device structure 202 having a stack structure 203 including tiers 210 of conductive structures 204 and insulating structures 206, and contact structures 226 electrically connected to the conductive structures 204 of the tiers 210 of the stack structure 203. The semiconductor device structure 202 may be free of stair step structures formed therein. The semiconductor device structure 202 (e.g., including the stack structure 203 having the tiers 210 of the conductive structures 204 and the insulating structures 206, and the contact structures 226) may be substantially similar to and may be formed in substantially the same manner as the semiconductor device structure 100 (e.g., including the stack structure 103 having the tiers 110 of the conductive structures 104 and the insulating structures 106, and the contact structures 126) previously described in with respect to FIGS. 1A through 10C. The semiconductor device 200 may further include vertical strings 212 of memory cells 214 coupled to each other in series, data lines 216 (e.g., bit lines), a source tier 218, access lines 208, first select gates 220 (e.g., upper select gates, drain select gates (SGDs)), select lines 222, a second select gate 224 (e.g., a lower select gate, a source select gate (SGS)), and additional contact structures 228. The vertical strings 212 of memory cells 214 extend vertically and orthogonal to conductive lines and tiers (e.g., the data lines 216, the source tier 218, the tiers 210 of the stack structure 203, the access lines 208, the first select gates 220, the select lines 222, the second select gate 224), and the contact structures 226 and the additional contact structures 228 may electrically couple components to each other as shown (e.g., the select lines 222 to the first select gates 220, the access lines 208 to the tiers 210 of the stack structure 203 of the semiconductor device structure 202). The semiconductor device 200 may also include at least one control device 230, which may include one or more of string driver circuitry, pass gates, circuitry for selecting gates, circuitry for selecting conductive lines (e.g., the data lines 216, the access lines 208), circuitry for amplifying signals, and circuitry for sensing signals. The control device 230 may, for example, be electrically coupled to the data lines 216, source tier 218, access lines 208, first select gates 220, and second select gate 224, for example.

Thus, in accordance with embodiments of the disclosure, a semiconductor device comprises a stack structure comprising longitudinally alternating conductive structures and insulating structures, the stack structure free of stair step structures at lateral ends thereof; and conductive contact structures within filled apertures in the stack structure and each individually in physical contact with the one of the conductive structures of the stack structure.

Figure 12:
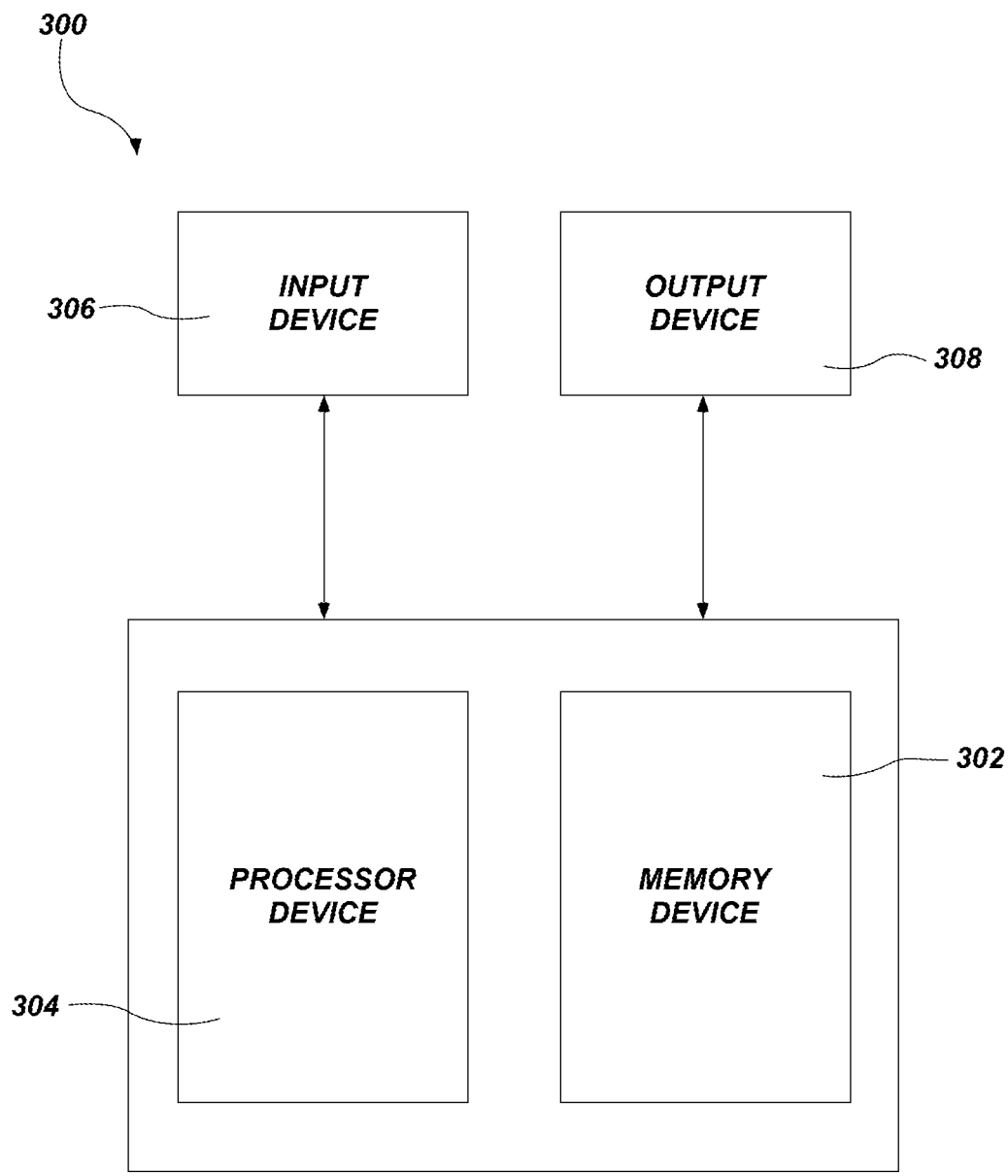
FIG. 12 is a schematic block diagram illustrating an electronic system, in accordance with embodiments of the disclosure.

Semiconductor devices (e.g., the semiconductor device 200) including semiconductor device structures (e.g., the semiconductor device structure 202) in accordance with embodiments of the disclosure may be used in embodiments of electronic systems of the disclosure. For example, FIG. 12 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 300 includes at least one memory device 302. The at least one memory device 302 may include, for example, an embodiment of the semiconductor device structure 100 previously described with respect to FIGS. 10A through 10C. The electronic system 300 may further include at least one electronic signal processor device 304 (often referred to as a "microprocessor"). The electronic signal processor device 304 may, optionally, include a semiconductor device structure similar to an embodiment of the semiconductor device structure 100 previously described with respect to FIGS.

10A through 10C. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The one or more input devices 306 and output devices 308 may communicate electrically with at least one of the memory device 302 and the electronic signal processor device 304.

Thus, in accordance with embodiments of the disclosure, an electronic system comprises a semiconductor device comprising a semiconductor device structure, conductive line structures, and a control device. The semiconductor device structure comprises a stack structure comprising longitudinally alternating conductive structures and insulating structures arranged in stacked tiers, each of the stacked tiers comprising one of the conductive structures and one of the insulating structures; and conductive contact structures within filled apertures in the stack structure and each individually electrically coupled to one of the conductive structures of the stack structure. The stack structure is free of stair step structures located at lateral ends of the stacked tiers. The conductive line structures are electrically coupled to the conductive contact structures of the semiconductor device structure. The control device is electrically coupled to the conductive line structures.

The methods and structures of the disclosure may substantially alleviate problems related to the formation and processing of conventional semiconductive device structures including stair step (e.g., staircase) structures. The methods and structures of the disclosure may not require as many processing acts (e.g., photolithography acts, material deposition acts, etching acts, planarization acts) and/or processing materials (e.g., fill materials, etchants) as compared to conventional methods of forming a semiconductor device structure including stair step structures, providing increased yield without a corresponding decrease in process efficiency and/or a significant increase in processing costs. In addition, the methods and structures of the disclosure do not suffer from the relatively small sizing and spacing error margins associated with properly forming stair step structures of conventional semiconductive device structures to receive contact structures thereon.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A device, comprising:
   a stack structure comprising vertically alternating conductive structures and insulating structures;
   filled openings vertically extending into the stack structure to different depths than one another, each of the filled openings individually comprising:
      conductive material on one of the conductive structures; and
      first portions of a dielectric material substantially horizontally surrounding the conductive material;
      second portions of the dielectric material vertically overlying surfaces of the stack structure outside of horizontal boundaries of the filled openings, the second portions of the dielectric material integral with the first portions of the dielectric material and continuously extending from and between pairs of the filled openings; and
   a control device vertically underlying the stack structure and electrically coupled to the conductive material of each of the filled openings.

2. The device of claim 1, wherein each of the filled openings vertically extends to a different conductive structure of the stack structure than each other of the filled openings.

3. The device of claim 1, wherein the filled openings are offset from one another in each of a first horizontal direction and a second horizontal direction perpendicular to the first horizontal direction.

4. The device of claim 1, wherein the filled openings are offset from one another in a first horizontal direction and are substantially aligned with one another in second horizontal direction perpendicular to the first horizontal direction.

5. The device of claim 1, wherein:
   the conductive material of each of the filled openings exhibits a horizontal width less than or equal to about 300 nm; and
   the conductive material of each of the filled openings is horizontally spaced apart from the conductive material of each other of the filled openings horizontally adjacent thereto by a distance less than or equal to about 1500 nm.

6. The device of claim 1, wherein:
   each of the filled openings individually exhibits a substantially circular lateral cross-sectional shape having a diameter less than or equal to about 500 nm; and
   each of the filled openings is horizontally spaced apart from each other of the filled openings horizontally adjacent thereto by a distance less than or equal to about 1000 nm.

7. The device of claim 1, wherein at least one of the filled openings exhibits one or more of a different horizontal cross-sectional shape and different horizontal cross-sectional dimensions than at least one other of the filled openings.

8. The device of claim 1, further comprising strings of memory cells vertically extending through the stack structure.

9. The device of claim 8, further comprising:
   data lines connected to the control device and the strings of memory cells; and
   access lines connected to the control device and the conductive material of each of the filled openings.

10. The device of claim 9, further comprising:
    select gates connected to the strings of memory cells; and
    select lines connected to the control device and the select gates.

11. A method, comprising:
    forming a stack structure comprising vertically alternating conductive structures and insulating structures;
    forming a hard mask material over the stack structure;
    forming openings extending through the hard mask material;

substantially filling the openings with a sacrificial material, upper boundaries of the sacrificial material substantially coplanar with upper boundaries of the hard mask material;

forming an additional mask material on the hard mask material and the sacrificial material;

subjecting the additional mask material, the sacrificial material, and the stack structure to a series of material removal processes to selectively remove portions of the additional mask material, portions of the sacrificial material not covered by remaining portions of the additional mask material, and portions of the stack structure not covered by one or more of the hard mask material and the remaining portions of the additional mask material to form apertures extending to different conductive structures of the stack structure;

forming a dielectric material on portions of the stack structure exposed within the apertures, the dielectric material substantially confined within the apertures; and forming conductive contact structures within the apertures, each conductive contact structure individually extending to and physically contacting a conductive structure of the stack structure at a bottom of one of the apertures.

12. The method of claim 11, wherein forming a hard mask material over the stack structure comprises forming one or more of a metal and a metal oxide on the stack structure.

13. The method of claim 11, wherein forming openings extending through the hard mask material comprises forming the openings to exhibit substantially circular horizontal cross-sectional shapes.

14. The method of claim 13, further comprising forming at least some of the openings to exhibit one or more of a different diameter and different spacing relative to at least some other of the openings.

15. The method of claim 11, wherein subjecting the additional mask material, the sacrificial material, and the stack structure to a series of material removal processes comprises:

performing a first material removal process comprising:
trimming a first width of the additional mask material to uncover a first of the openings filled with the sacrificial material; and
removing the sacrificial material within the first of the openings and a portion of a first of the insulating structures underlying the first of the openings; and performing a second material removal process after the first material removal process, the second material removal process comprising:

trimming a second width of the additional mask material to uncover a second of the openings filled with the sacrificial material;

removing an exposed portion of a first of the conductive structures underlying the first of the openings; and removing the sacrificial material within the second of the openings, another portion of the first of the insulating structures underlying the second of the openings, and a portion of a second of the insulating structures underlying the first of the openings.

16. The method of claim 11, further comprising:

forming a chop mask material within one or more of the apertures prior to forming the dielectric material on the portions of the stack structure exposed within the apertures; and increasing depths of one or more other of the apertures after forming the chop mask material within the one or more of the apertures.

17. An electronic system, comprising:
an input device;
an output device;
a processor device operably coupled to the input device and the output device; and
a memory device operably coupled to the processor device and comprising:
a stack structure comprising vertically alternating conductive structures and insulating structures;
conductive contact structures vertically extending through portions of the stack structure to different conductive structures of the stack structure than one another;
a dielectric material comprising:
first portions horizontally intervening between the conductive contact structures and the portions of the stack structure; and
second portions continuous with the first portions and vertically overlying an uppermost surface of the stack structure;
strings of memory cells vertically extending through the stack structure; and
a control device vertically underlying the stack structure and electrically coupled to the conductive contact structures.

18. The electronic system of claim 17, further comprising a dielectric material horizontally intervening between the conductive contact structures and the portions of the stack structure.

19. The electronic system of claim 17, wherein all of the conductive structures and all of the insulating structures have horizontal ends substantially aligned with one another.

* * * * *